(12) United States Patent
Sarkar et al.

(10) Patent No.: US 12,653,023 B2
(45) Date of Patent: Jun. 9, 2026

(54) STACKED FIELD-EFFECT TRANSISTOR DEVICE WITH BACKSIDE CUT FOR TOP SOURCE/DRAIN ACCESS

(71) Applicant: International Business Machines Corporation, Armonk, NY (US)

(72) Inventors: Debarghya Sarkar, Latham, NY (US); Ruilong Xie, Niskayuna, NY (US); Albert M. Chu, Nashua, NH (US); Brent A. Anderson, Jericho, VT (US); Junli Wang, Slingerlands, NY (US); Jay William Strane, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 451 days.

(21) Appl. No.: 18/512,825

(22) Filed: Nov. 17, 2023

(65) Prior Publication Data

US 2025/0167118 A1     May 22, 2025

(51) Int. Cl.
| | |
|---|---|
| *H10W 20/41* | (2026.01) |
| *H10D 30/01* | (2025.01) |
| *H10D 30/43* | (2025.01) |
| *H10D 30/67* | (2025.01) |
| *H10D 62/10* | (2025.01) |
| *H10D 84/01* | (2026.01) |
| *H10D 84/03* | (2025.01) |
| *H10D 84/85* | (2025.01) |
| *H10D 88/00* | (2026.01) |

(52) U.S. Cl.
CPC ........ *H10W 20/427* (2026.01); *H10D 30/014* (2025.01); *H10D 30/43* (2025.01); *H10D 30/6729* (2025.01); *H10D 30/6735* (2025.01);

*H10D 62/121* (2025.01); *H10D 84/0186* (2025.01); *H10D 84/038* (2025.01); *H10D 84/856* (2025.01); *H10D 88/01* (2025.01)

(58) Field of Classification Search
CPC ............ H10W 20/427; H10W 20/481; H10W 20/076; H10W 20/069; H10W 20/0696; H10D 30/014; H10D 30/43; H10D 30/6729; H10D 30/6735; H10D 30/6757; H10D 62/121; H10D 84/0186; H10D 84/038; H10D 84/856; H10D 84/0149; H10D 84/83; H10D 84/8311; H10D 84/85; H10D 88/01; H10D 88/00; H10D 64/251
See application file for complete search history.

(56) References Cited

U.S. PATENT DOCUMENTS

| | | |
|---|---|---|
| 10,192,819 B1 | 1/2019 | Chanemougame |
| 10,192,867 B1 | 1/2019 | Frougier |

(Continued)

*Primary Examiner* — William B Partridge
*Assistant Examiner* — Chevy J Boegel
(74) *Attorney, Agent, or Firm* — Gavin Giraud

(57) ABSTRACT

Embodiments disclosed herein include a semiconductor structure. The semiconductor structure may include a first top transistor comprising a first source/drain (S/D) region and a first bottom transistor with a second S/D region. The first bottom transistor may be stacked directly below the first transistor. The semiconductor structure may also include a backside power delivery network (BSPDN) below the bottom transistor, a back-end-of-line (BEOL) metal level above the top transistor, and a first interlevel via electrically connecting a top of the first S/D region to the BSPDN.

20 Claims, 26 Drawing Sheets

(56)  References Cited

U.S. PATENT DOCUMENTS

| 10,510,622 B1 | 12/2019 | Frougier | |
| 11,444,082 B2 | 9/2022 | Smith | |
| 2020/0075574 A1 | 3/2020 | Smith | |
| 2020/0294998 A1 | 9/2020 | Lilak | |
| 2021/0391421 A1 | 12/2021 | Chu | |
| 2021/0399099 A1 | 12/2021 | Chu | |
| 2021/0407999 A1 | 12/2021 | Huang | |
| 2022/0352032 A1 | 11/2022 | Lilak | |
| 2023/0036597 A1* | 2/2023 | Smith | H10D 84/038 |
| 2023/0068065 A1* | 3/2023 | Khaderbad | H10D 30/014 |

* cited by examiner

100

100

STACKED FIELD-EFFECT TRANSISTOR DEVICE WITH BACKSIDE CUT FOR TOP SOURCE/DRAIN ACCESS

BACKGROUND

The present invention relates generally to the field of semiconductor device fabrication, and more particularly to fabricating a passthrough backside contact formed through at least a portion of a bottom source/drain to provide access to a top source/drain.

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

As semiconductor microchips and integrated circuits become smaller, stacked FETs are an attractive option to provide higher transistor density in a given footprint by stacking one device over another.

SUMMARY

Aspects of an embodiment of the present invention include a semiconductor structure. The semiconductor structure may include a first bottom transistor with a first bottom source/drain (S/D) electrically connected to a back-end-of-line (BEOL) metal level. The semiconductor structure may also include a second bottom transistor with a second bottom S/D electrically connected to a backside power delivery network (BSPDN) below the first bottom transistor and the second bottom transistor. The semiconductor structure may also include a first top transistor stacked directly above the first bottom transistor comprising a first top S/D electrically connected to the BSPDN by a passthrough backside contact formed through at least a portion of the first bottom S/D.

Aspects of an embodiment of the present invention encompass a method of fabricating a semiconductor structure. The method may include forming a stacked field-effect transistor (FET) with a first top transistor stacked directly above a first bottom transistor, forming a back-end-of-line (BEOL) metal level with a first bottom contact electrically connected between the BEOL metal level and the first bottom transistor, forming a passthrough backside contact hole through at least a portion of a first bottom source/drain (S/D) of the first bottom transistor, forming a self-aligned isolation spacer in the passthrough backside contact hole, and forming a conductive core within the isolation spacer. The conductive core may electrically connect a top S/D of the first top transistor to a backside power delivery network.

Aspects of an embodiment of the present invention include a semiconductor structure. The semiconductor structure may include a first top source/drain (S/D), a first bottom S/D stacked directly below the first top S/D, a backside power delivery network (BSPDN) below the bottom S/D, a back-end-of-line (BEOL) interconnect network above the top S/D, and a passthrough backside contact electrically connecting the first bottom S/D to the BSPDN.

DETAILED DESCRIPTION

Figures 1, 2A:
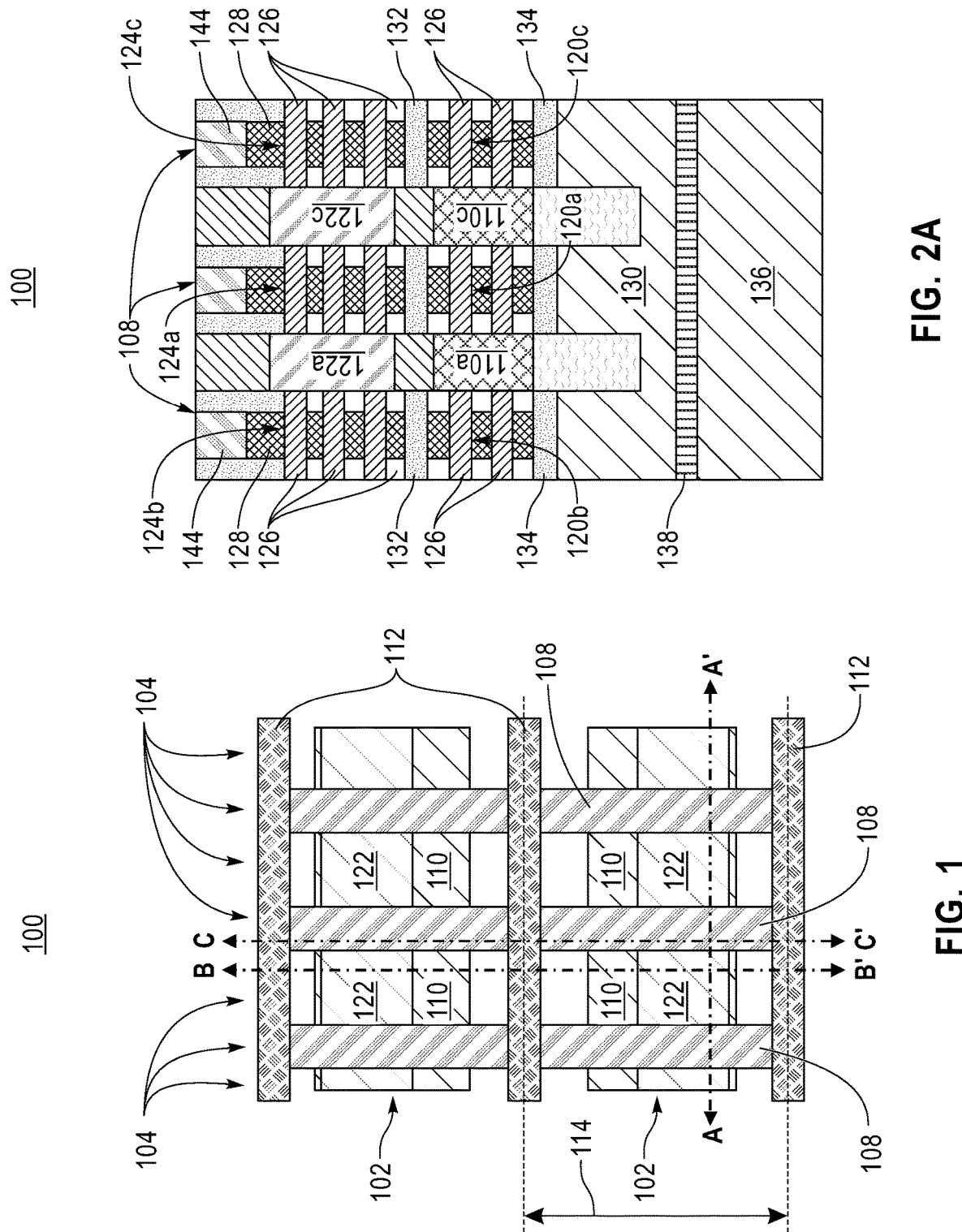
FIG. 1 depicts a schematic top view of a semiconductor structure at a stage of fabrication, in accordance with one embodiment of the present invention.
FIGS. 2A, 2B, and 2C depict the semiconductor structure of FIG. 1 at a fabrication stage, in accordance with one embodiment of the present invention.

In the following detailed description, reference is made to the accompanying drawings, which show specific examples of embodiments of the invention. These embodiments are described in sufficient detail to enable those skilled in the art to practice them, and it is to be understood that other embodiments may be utilized, and that structural, logical, and electrical changes may be made without departing from the described embodiments. The following detailed description is, therefore, not to be taken in a limiting sense, and the included embodiments are defined by the appended claims.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

References in the specification to "one embodiment," "an embodiment," "certain embodiments," etc., indicate that the embodiment described may include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "right," "left," "vertical," "horizontal," "top," "bottom," and derivatives thereof shall relate to the disclosed structures and methods, as oriented in the drawing Figures. The terms "above," "below," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that when an element as a layer, region or substrate is referred to as being "on" or "over" another element, it can be directly on the other element or intervening elements may also be present. In contrast, when an element is referred to as being "directly adjacent," "directly on," or "directly over" another element, there are no intervening elements present. It will also be understood that when an element is referred to as being "beneath" or "under" another element, it can be directly below or under the other element, or intervening elements may be present. Additionally, when an element is referred to as being "directly below" or "directly above" another element, intervening elements may be present, but the elements overlap at least partially relative to a vertical axis perpendicular to a major surface. With regard to the fabrication of transistors and integrated circuits, major surface refers to that surface of the semiconductor layer in and about which a plurality of transistors are fabricated, e.g., in a planar process. As used herein, the term "vertical" means substantially orthogonal with respect to the major surface and "horizontal" means substantially parallel to the major surface. Typically, the major surface is along a plane of a monocrystalline silicon layer on which transistor devices are fabricated. Each reference number may refer to an item individually or collectively as a group. For example, a contact 202 may refer to a single contact 202 or multiple contacts 202.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. In some embodiments, epitaxial growth and/or deposition processes can be selective to forming on semiconductor surfaces and may or may not deposit material on other exposed surfaces, such as silicon dioxide or silicon nitride surfaces.

Example embodiments are described herein with reference to cross-sectional illustrations that are schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope.

It is to be understood that other embodiments may be used, and structural or logical changes may be made, without departing from the spirit and scope defined by the claims. The description of the embodiments is not limiting. In particular, elements of the embodiments described hereinafter may be combined with elements of different embodiments.

In some embodiments, etching mask layer(s) may be provided, and the layers that are not protected thereby are removed. For example, as is understood in the art, a mask layer, sometimes referred to as a photomask, may be provided by forming a layer of photoresist material on another layer, exposing the photoresist material to a pattern of light, and developing the exposed photoresist material. An etching process, such as a reactive ion etch (RIE), may be used to form patterns (e.g., openings) by removing portions of another layer. After etching, the mask layer may be removed using a conventional plasma ashing or stripping process. Accordingly, the pattern of the mask layer facilitates the removal of another layer, such as an amorphous SiO2 layer and/or a conductive oxide diffusion barrier, for example, in areas where the mask layer has not been deposited.

For the sake of brevity, conventional techniques related to semiconductor structure and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor structures and semiconductor-based ICs are well known and so, in the interest of brevity, many conventional steps will only be mentioned briefly herein or will be omitted entirely without providing the well-known process details.

Improvements in the design of integrated circuits (IC) have enabled feature sizes for transistors in a device layer to enter into deep submicron and nanometer regime. Embodiments herein recognize benefits from separating the power delivery components from the signal wires. A backside power delivery network (BSPDN) and/or backside power rails (BPR), for example, can greatly improve the routability for field-effect transistor (FET). Improving routability means the design of the IC provides easier connection between source/drains, gates, etc. and the other components of the IC. The BSPDN and BPR enable space on a backside (i.e., below a plane at a bottom of the device layer) to be utilized for power delivery (e.g., metal levels of wires and vias to convey the power signals to the devices in the device layer) while space on a frontside (i.e., above a plane at a top of the device layer) can provide the signal wires with more room for misalignment without defects. For stacked FET, connections between top epi regions of the source/drains and the BSPDN/BPR can be difficult, however. Specifically, the formation of the contacts for source/drain regions for both top and bottom FETs to signal lines or power supplies is challenging because top device could shadow the bottom device during contact formation.

The embodiments described herein, therefore, are fabricated with a passthrough backside contact formed through at least a portion of a bottom source/drain while the remainder of the bottom source/drain stays functional. The remainder of the bottom source/drain may be fabricated to electrically connect with the frontside metal layers of the back-end-of-line (BEOL) network. In certain embodiments a semiconductor structure may include a first bottom transistor with a first bottom source/drain (S/D) electrically connected to a back-end-of-line (BEOL) metal level, a second bottom transistor with a second bottom S/D electrically connected to a backside power delivery network (BSPDN) below the first bottom transistor and the second bottom transistor, and a first top transistor stacked directly above the first bottom transistor with a first top S/D electrically connected to the BSPDN by a passthrough backside contact formed through at least a portion of the first bottom S/D. The stacked transistors potentially complicate the connections between the transistors and the BEOL, and between the transistors and the BSPDN. The passthrough backside contact formed through at least a portion of the first bottom S/D improves the connection between the top transistor and the BSPDN without sacrificing functionality of the bottom transistor (with the accompanying bottom S/D). The passthrough backside contact may include a self-aligned isolation spacer isolating a conductive core from a channel of the first bottom transistor and a gate of the first bottom transistor. The self-aligned isolation spacer further increases efficiency and lowers the number of defects due to isolating the passthrough backside contact from the first bottom S/D. The conductive core connects solidly to the first top transistor with a reduced danger of shorting to the first bottom S/D.

In certain embodiments, the first bottom transistor may include a forksheet device or a gate all-around nanosheet device. These two types of transistor devices are selected based on the design necessities of the channel. In a forksheet device, the gate metal (also called high-k metal gate) is formed between nanosheets and on one sidewall, but the gate metal is not necessarily formed all-around the nanosheets, whereas in a gate all-around device, the gate metal is formed between the nanosheets and around the nanosheets. Both types of devices can provide strong activation of the channel region.

In certain embodiments, a semiconductor structure can include a high-metal gate surrounding a channel of the first top transistor and a channel of the first bottom transistor. This provides the technical benefit of activating both transistors with a single contact, which increases efficiency and chip density by reducing space required for each transistor. In certain embodiments a semiconductor structure may also include a middle dielectric isolation directly between the first top transistor and the first bottom transistor. The middle dielectric isolation further increases density by shielding the channel regions from the top and bottom transistors, which, in combination with the passthrough backside contact, enables signals from the top S/D to the BSPDN to propagate without shorting to the gate, the bottom S/Ds, or any other unintended component of the semiconductor structure. In certain embodiments, the second bottom S/D may include a lateral dimension that is two times bigger than a lateral dimension of the first top S/D. This provides the technical benefit of enabling the bottom S/D to function properly: conveying a signal from the nanosheet channels, even with a portion being taken up and formed through by the passthrough backside contact.

Certain embodiments of the disclosed invention include a method of fabricating a semiconductor structure. The method may include forming a stacked field-effect transistor (FET) with a first top transistor stacked directly above a first bottom transistor. The stacked FET increases the density of the semiconductor structure since most of the space taken up by FETs is usually lateral. Stacking thus has the potential to double the number of devices for a given area of the semiconductor structure formed, for example, on a wafer. The method may further include forming a back-end-of-line (BEOL) metal level with a first bottom contact electrically connected between the BEOL metal level and the first bottom transistor, which increases the utility and feasibility of the stacked FET by enabling signals to both layers of the stacked FET structure. The method may also include forming a passthrough backside contact hole through at least a portion of a first bottom source/drain (S/D) of the first bottom transistor, forming a self-aligned isolation spacer in the passthrough backside contact hole, and forming a conductive core within the isolation spacer. The conductive core may electrically connect a top S/D of the first top transistor to a backside power delivery network (BSPDN). This passthrough backside contact formed from the isolation spacer and the conductive core provides the technical benefit of signals passing from the BSPDN to the top S/D without shorting to the gate, other S/Ds, or any other unintended components of the semiconductor structure.

In certain embodiments, a method of forming a semiconductor structure with a passthrough backside contact may include flipping the semiconductor structure and removing a substrate. This enables routine semiconductor fabrication methods to be used on both sides of a wafer for forming the semiconductor structure. The method may also include forming a contact opening in an interlayer dielectric between the isolation spacer and the top S/D. This provides the technical benefit of forming a more robust connection between the conductive core and the top S/D without the isolation spacer being in the way, and without the precision required to form the isolation spacer right next to the top S/D. The method may also include forming a bottom backside contact between a second bottom S/D and the BSPDN. The bottom backside contact provides the technical benefit conveying signals between the bottom transistor(s) and the BSPDN. The method may also include forming a portion of a gate of the first bottom transistor after forming the pass-through backside contact hole. This portion of the gate may, for example, complete an all-around gate for a transistor that is designed to function with such a gate all-around. In certain embodiments of the method, forming the first bottom transistor may include forming a forksheet device that has the gate between the nanosheets and on one sidewall, but not all around the nanosheets. The forksheet device provides the technical benefit of a smaller footprint of the gate metal/HKMG.

The present invention and an example fabrication process will now be described in detail with reference to the Figures.

FIG. 1 depicts a schematic top view of a semiconductor structure 100 at a stage of fabrication, in accordance with one embodiment of the present invention. The semiconductor structure 100 includes rows 102 of stacked field-effect transistor (FET) devices and columns 104 of gate and source/drains (S/Ds) fabricated in a device layer of the semiconductor device 100. The columns 104 include gates 108 that control channels between S/Ds 110. The semiconductor structure 100 will eventually include contacts to electrically connect certain of the S/Ds 110 to a back-end-of-line (BEOL) interconnect network on a front side (illustrated in subsequent figures below) above the device layer of the semiconductor structure 100; and certain of the S/Ds 110 to a backside power delivery network (BSPDN) on a back side (illustrated in subsequent figures below) below the device layer. The semiconductor structure 100 includes other components (e.g., shallow trench isolation, interlayer dielectric) that are not illustrated in FIG. 1 so that the rows and columns of the semiconductor structure 100 may be more easily described. Gate cuts 112 isolate and separate the transistors laterally and define a cell width 114 (also known in some instances as a cell height) that represents the density of the semiconductor structure 100.

Figures 2B, 2C:
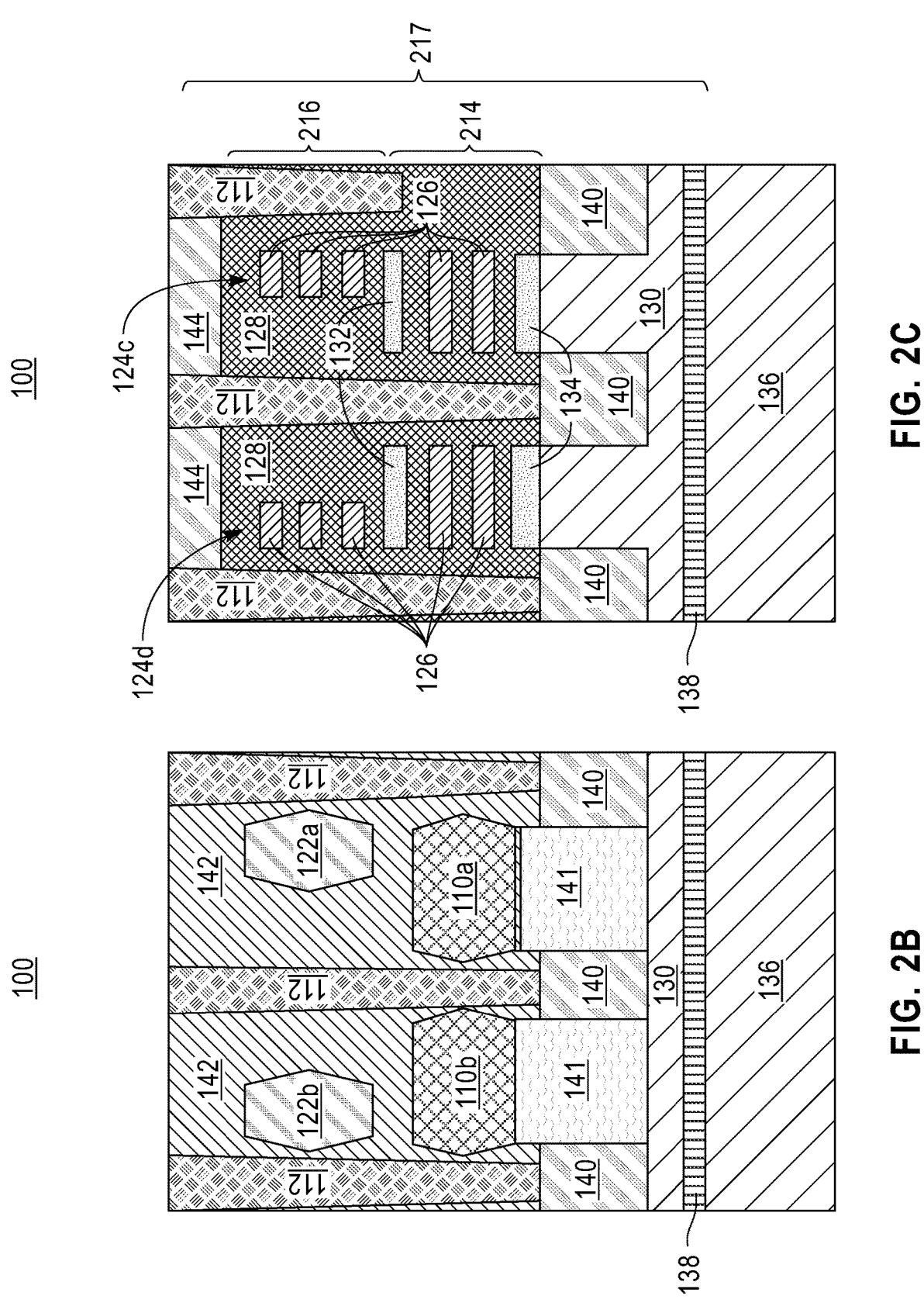

FIGS. 2A, 2B, and 2C depict the semiconductor structure 100 of FIG. 1 at a fabrication stage, in accordance with one embodiment of the present invention. FIG. 2A is a cross-sectional side view of one row 102 of the semiconductor structure 100 along line A-A' of FIG. 1; FIG. 2B is a cross-sectional side view of the S/Ds 110 of the semiconductor structure 100 along line B-B' of FIG. 1; and FIG. 2C is a cross-sectional side view of one of the gates 108 of the semiconductor structure 100 along line C-C' of FIG. 1.

The semiconductor structure 100 includes bottom nanosheet FETs 214 stacked directly below top nanosheet FETs 216 in a device layer 217. The bottom nanosheet FETs 214 include a first bottom source/drain (S/D) 110a (FIG. 2A, 2B), a second bottom S/D 110b (FIG. 2B), and a third bottom S/D 110c (FIG. 2A). The first bottom S/D 110a and the third bottom S/D 110c are separated by a first bottom gate 120a. Additional bottom gates 120b, c may be formed between the bottom S/Ds 110a, b, c along each of the rows 102.

Similarly to the bottom FETs 214, the top nanosheet FETs 216 include a first top source/drain (S/D) 122a (FIGS. 2A, 2B), a second top S/D 122b (FIG. 2B), and a third top S/D 122c (FIG. 2A). The first top S/D 122a and the third top S/D 122c are separated by a first top gate 124a. Additional top gates 124b, c may be formed between the top S/Ds 122a, b, c along each of the rows 102. The bottom S/Ds 110a, b, c, may be fabricated with a lateral dimension that is bigger (e.g., two times) than a lateral dimension of the top S/Ds 122a, b, c. This larger lateral dimension enables the pass-through backside contact described below to pass through the first bottom S/D 110a without affecting the operation of the bottom S/D 110a. The second bottom S/D 110b and third bottom S/D 110c also function without any problems.

The nanosheet FETs 214, 216 may be formed, for example, as alternating series of channel layers 126 and sacrificial layers (not shown) in vertical layer stacks. The channel layers 126 (i.e., nanosheets or nanowires) may be composed of a semiconductor material, such as silicon (Si). The sacrificial layers may include a different semiconductor material, such as silicon germanium (SiGe). The layers of the FETs 214, 216 may be formed by an epitaxial growth process. After the layers are built up, the sacrificial layers are removed cleanly from the channel layers 126 and replaced with a high-K metal gate (HKMG) 128. As used herein, the term "cleanly" in reference to a material removal process (e.g., etching) denotes that, with an appropriate etchant choice, the material removal rate (i.e., etch rate) for the targeted material is greater than the removal rate for at least another material exposed to the material removal process.

The number of channel layers 126 in the FETs 214, 216 may differ (more layers or fewer layers) from the number depicted in the representative embodiment. Each of the gates 124a, b, c, d may have one instance of the HKMG 128 that surrounds both the channel layers 126 of the top transistor 216 and of the bottom transistor 214 for each stacked FET pair. The channel layers 126 may be isolated from each other (i.e., top transistors 216 from bottom transistors 214) by a middle dielectric isolation layer 132 and from a substrate 130 by a bottom dielectric isolation layer 134. The substrate 130 supports the steps of fabricating the device layer 117 of the semiconductor structure 100 and is structurally strengthened by a structural substrate 136 that is separated from the substrate 130 by an etch-stop layer 138.

The rows 102 of FET devices are isolated by shallow trench isolation (STI) 140, which may be a buried oxide (BOX) layer of a semiconductor-on-insulator (SOI) substrate or dielectric isolation in a bulk substrate. The STI 140 may be replaced in certain areas by a placeholder 141 that may be replaced by a backside bottom contact as detailed below. Above the STI 140 in the device layer 117, the semiconductor structure 100 includes the gate cuts 112. Each gate cut 112 is insulated from other gate cuts 112 by interlayer dielectric (ILD) 142 that may be formed after forming bottom and top S/Ds 110a, b, c, d, 122a, b, c, d. The ILD 142 may also be formed between the bottom FETs 214 and the top FETs 216. The semiconductor structure 100 may include middle-of-line (MOL) ILD 144 that is deposited above the FETs 214, 216 and the gate cuts 112 after replacement gate formation.

Figure 3A:
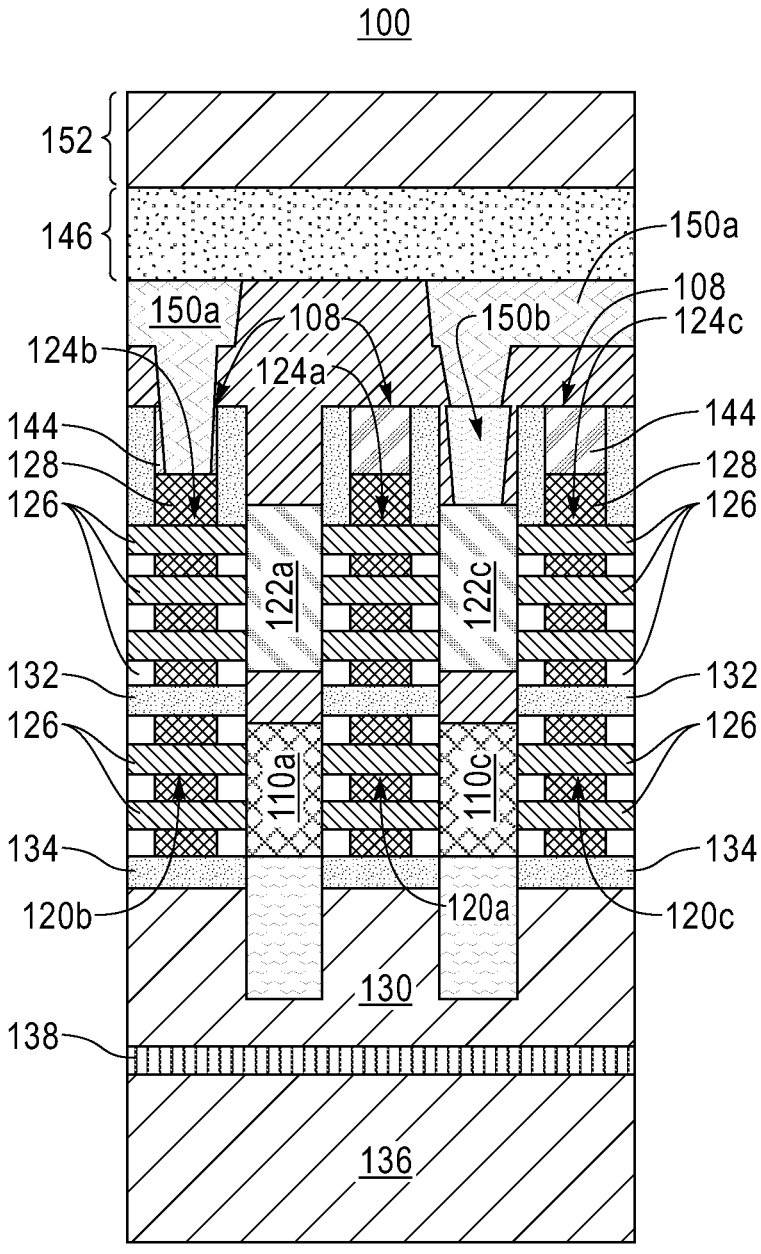
FIGS. 3A, 3B, and 3C depict cross-sectional side views of the semiconductor structure of FIG. 1 at a subsequent fabrication stage, in accordance with one embodiment of the present invention.
Figure 3C:
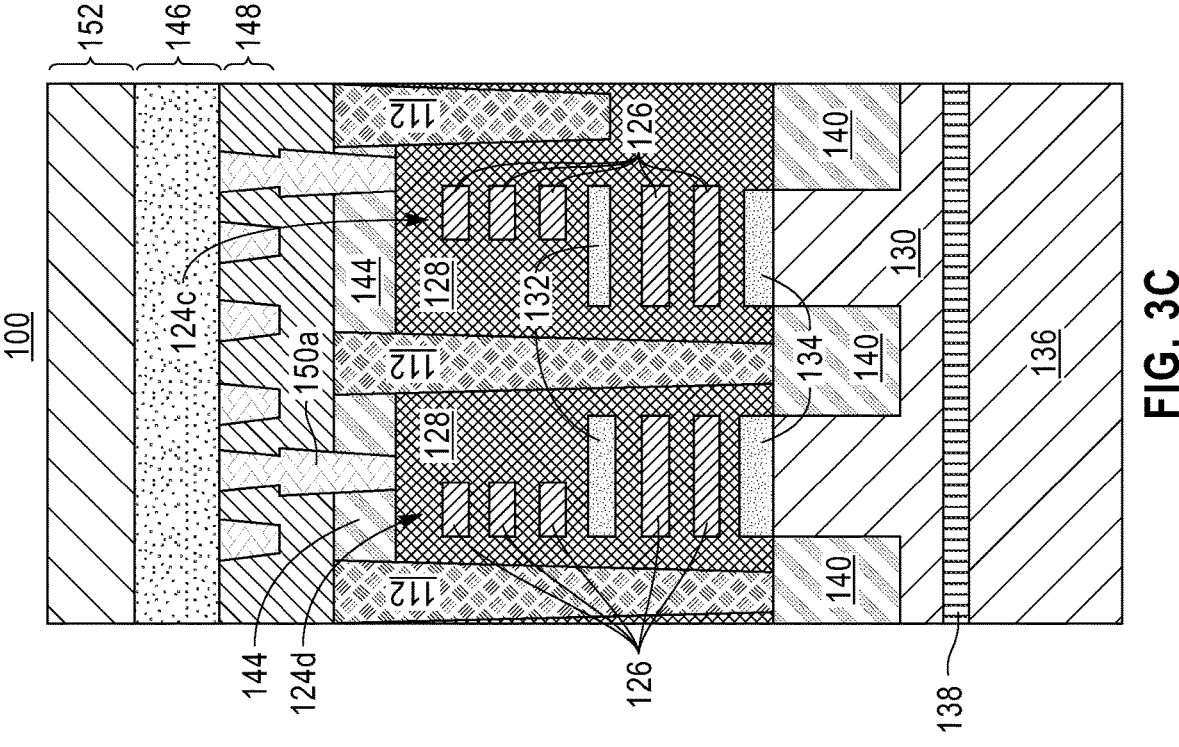
Figure 3B:
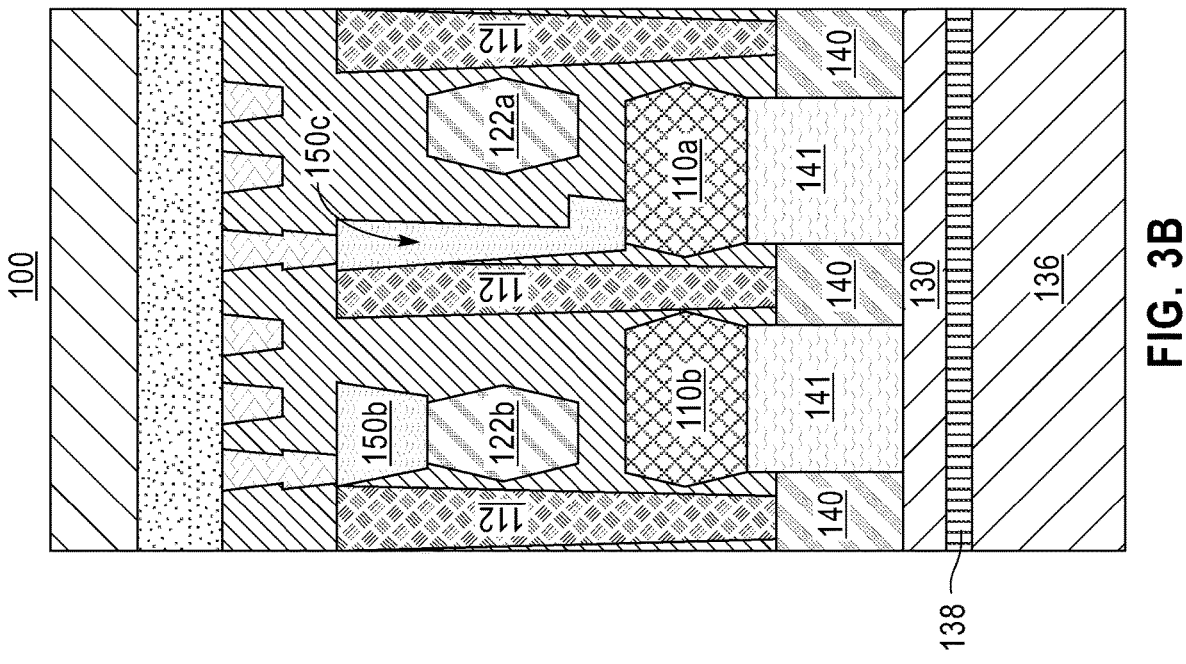

FIGS. 3A, 3B, and 3C depict cross-sectional side views of the semiconductor structure 100 of FIG. 1 at a subsequent fabrication stage, in accordance with one embodiment of the present invention. The cross-sectional side views are from the same locations as the figures above. The semiconductor structure 100 includes a back-end-of-line (BEOL) 146 and a first metal level 148 that electrically connect the transistors 214, 216 of the device level 117 to external components. The BEOL 146 is not shown to scale and may include many metal levels of signal wires and lines interconnected with vias and other known connecting components. The first metal level 148 is connected to the device level 117 through frontside contacts 150: including frontside gate contacts (vias) 150a, frontside top device contacts 150b, and frontside bottom device contacts 150c. The frontside gate contacts 150a are first formed as holes etched through the MOL ILD 144 and frontside top contacts 150b and frontside bottom contacts 150c are formed as holes etched through the ILD 142 (e.g., potentially multiple holes or holes etched in multiple stages) to the second top S/D 122b, third top S/D 122c (not the first top S/D 122a), and the first bottom S/D 110a.

The contacts 150a, b, c may be etched using lithographical patterning and etch processes such as extreme ultraviolet (EUV) lithography and plasma dry etch process. The holes are then filled with a conductive material, such as metal, and may also include a silicide liner, an adhesion metal liner, and/or a conductive metal fill. The semiconductor structure 100 may then be polished to be flush with the MOL ILD 144 before formation of the remaining metal layers of the BEOL 146. The semiconductor structure 100 may also include a carrier wafer 152 that is formed above the BEOL 146 so that the semiconductor structure 100 can be flipped, enabling processes to be applied to the backside of the semiconductor structure 100.

Figure 4A:
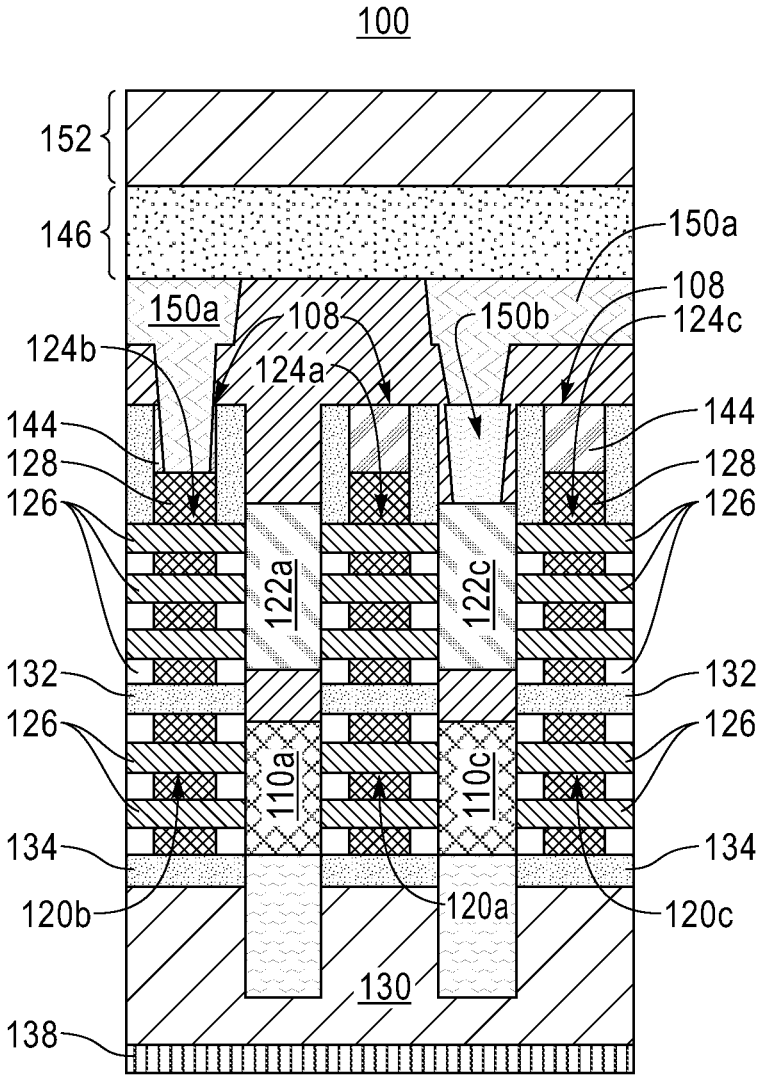
FIGS. 4A, 4B, and 4C depict cross-sectional side views of the semiconductor structure of FIG. 1 at a fabrication stage of the processing method, in accordance with one embodiment of the present invention.
Figure 4C:
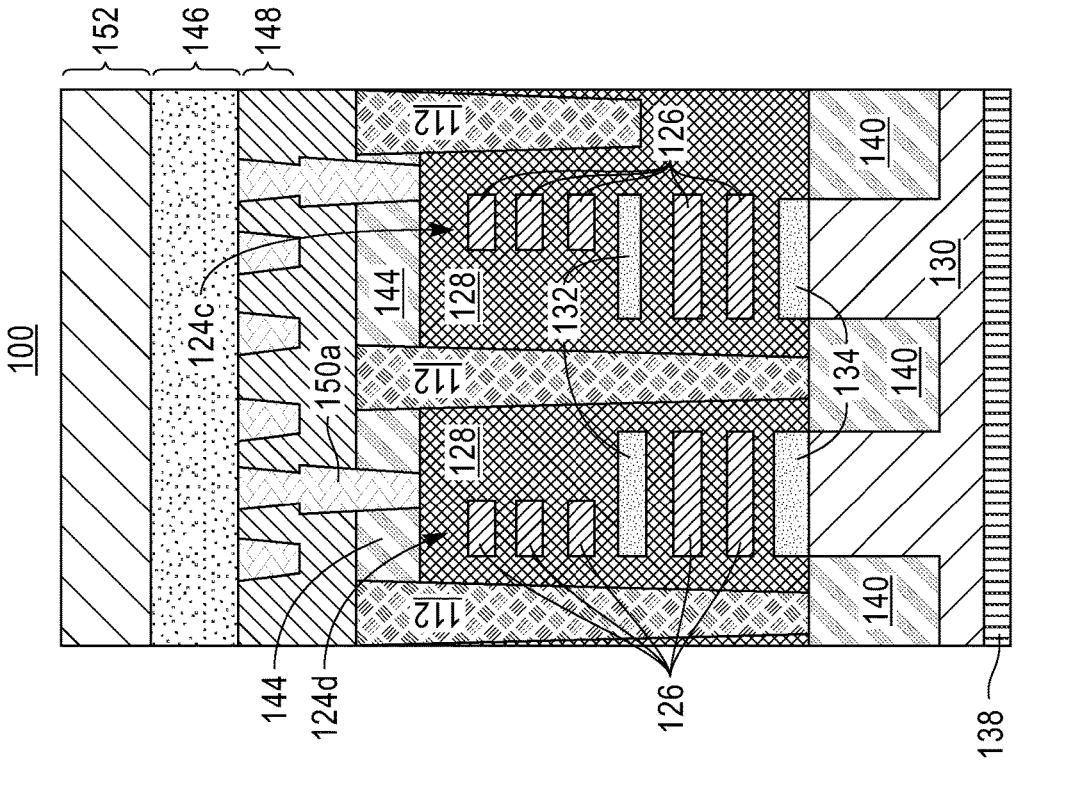
Figure 4B:
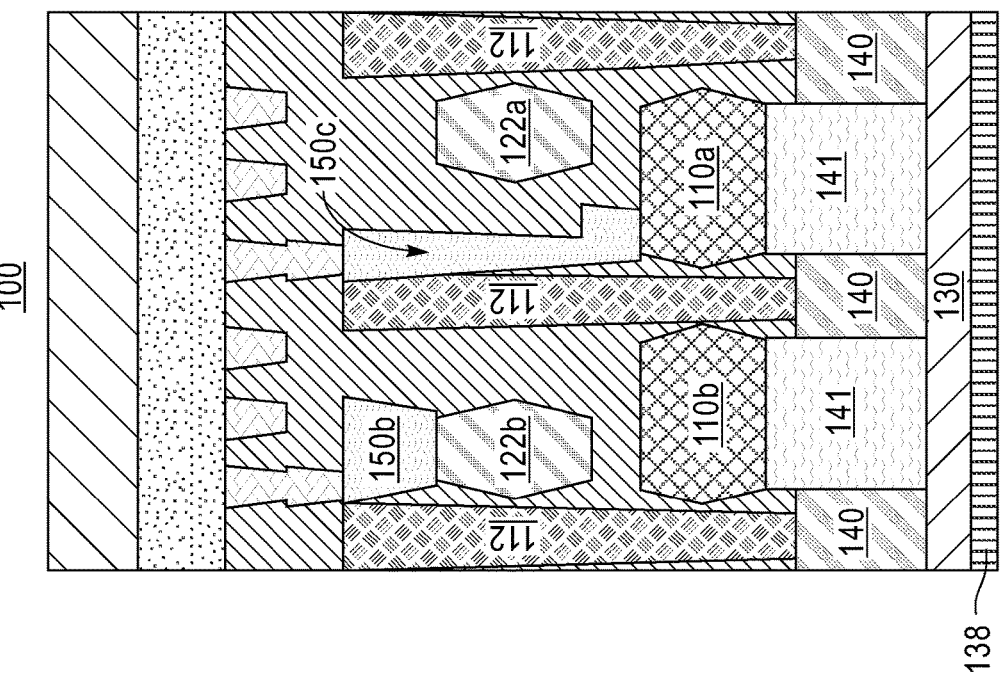

FIGS. 4A, 4B, and 4C depict cross-sectional side views of the semiconductor structure 100 of FIG. 1 at a fabrication stage of the processing method, in accordance with one embodiment of the present invention. The cross-sectional views are from the same locations as the figures above. The semiconductor structure 100 has the structural substrate 136 removed down to the etch stop layer 138 which prevents a rough etch from damaging the substrate 130 or other backside components of the semiconductor structure 100.

Figure 5A:
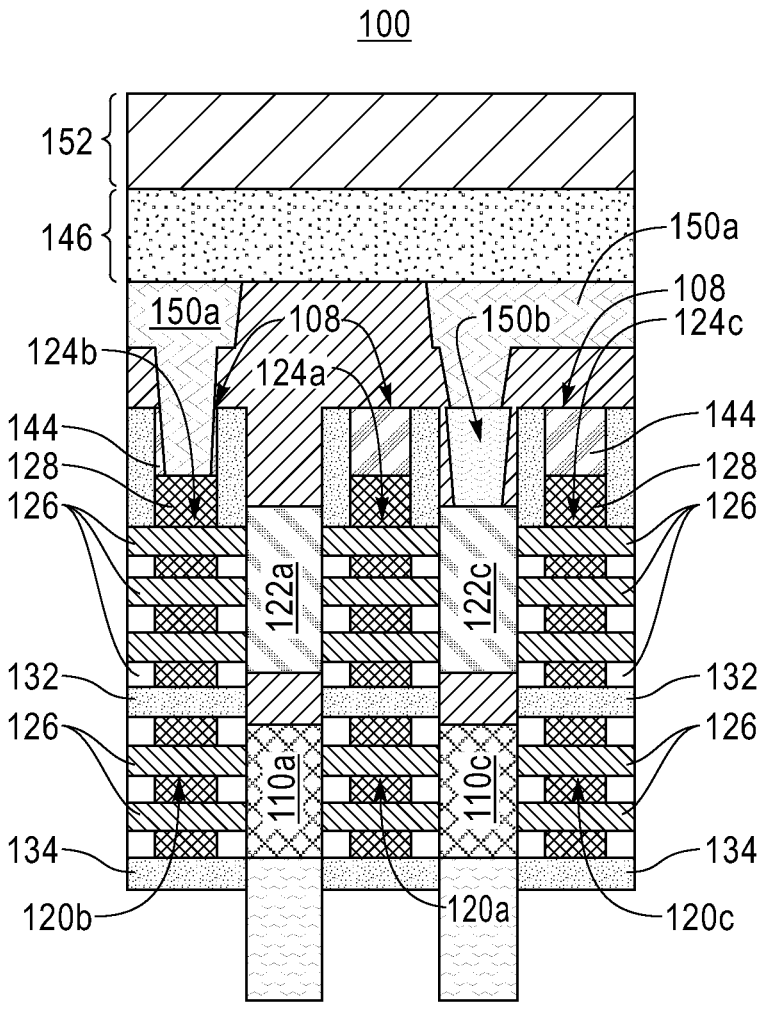
FIGS. 5A, 5B, and 5C depict cross-sectional side views of the semiconductor structure of FIG. 1 at a subsequent fabrication stage of the processing method, in accordance with one embodiment of the present invention.
Figure 5C:
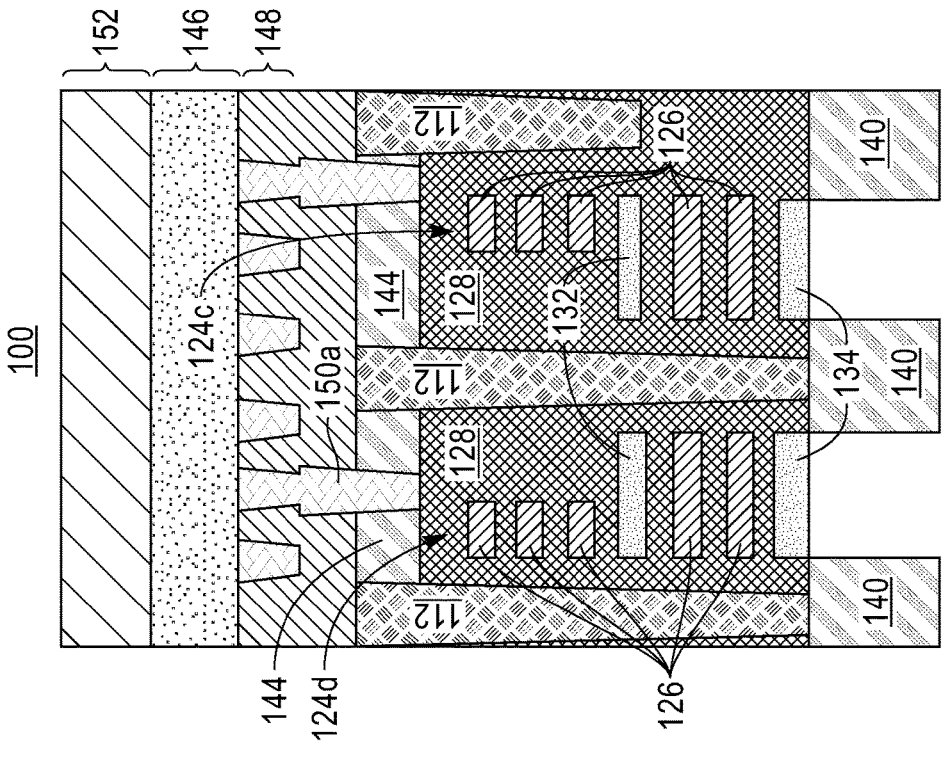
Figure 5B:
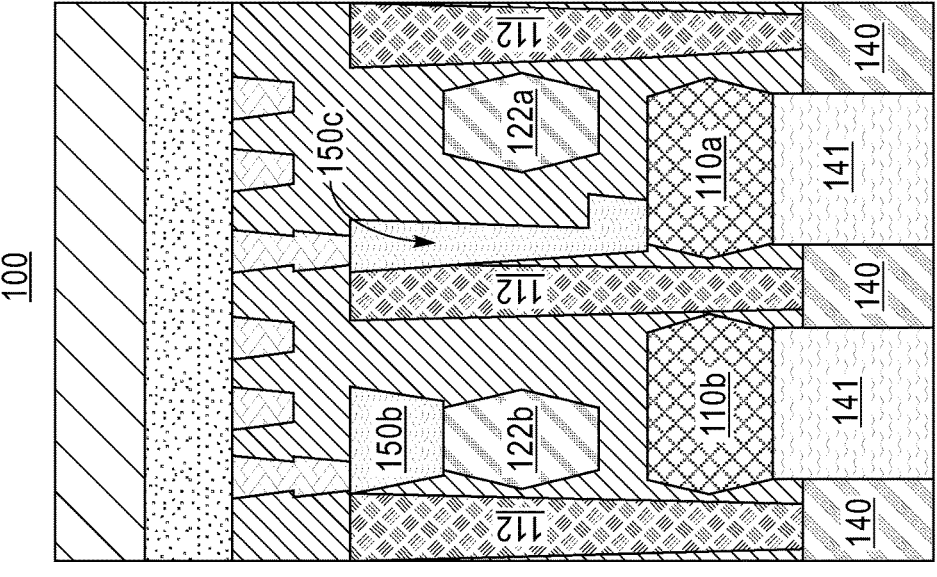

FIGS. 5A, 5B, and 5C depict cross-sectional side views of the semiconductor structure 100 of FIG. 1 at a subsequent fabrication stage of the processing method, in accordance with one embodiment of the present invention. The cross-sectional side views are from the same locations as the figures above. The semiconductor structure 100 at this stage has the etch stop layer 136 and the substrate 130 removed. The substrate 130 may be removed using a finer etch process that selectively removes the silicon of the substrate 130 without affecting the bottom dielectric isolation 134, the placeholders 141, and the STI 138.

Figure 6A:
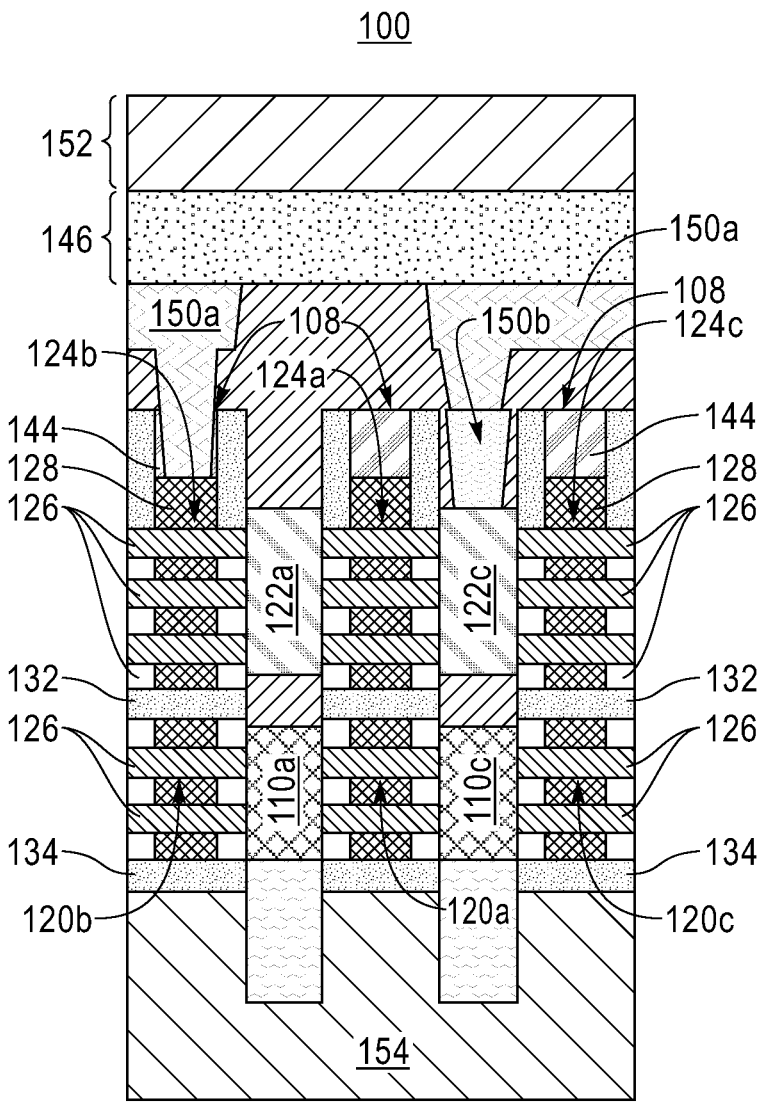
FIGS. 6A, 6B, and 6C depict cross-sectional side views of the semiconductor structure of FIG. 1 at a subsequent fabrication stage of the processing method, in accordance with one embodiment of the present invention.
Figure 6C:
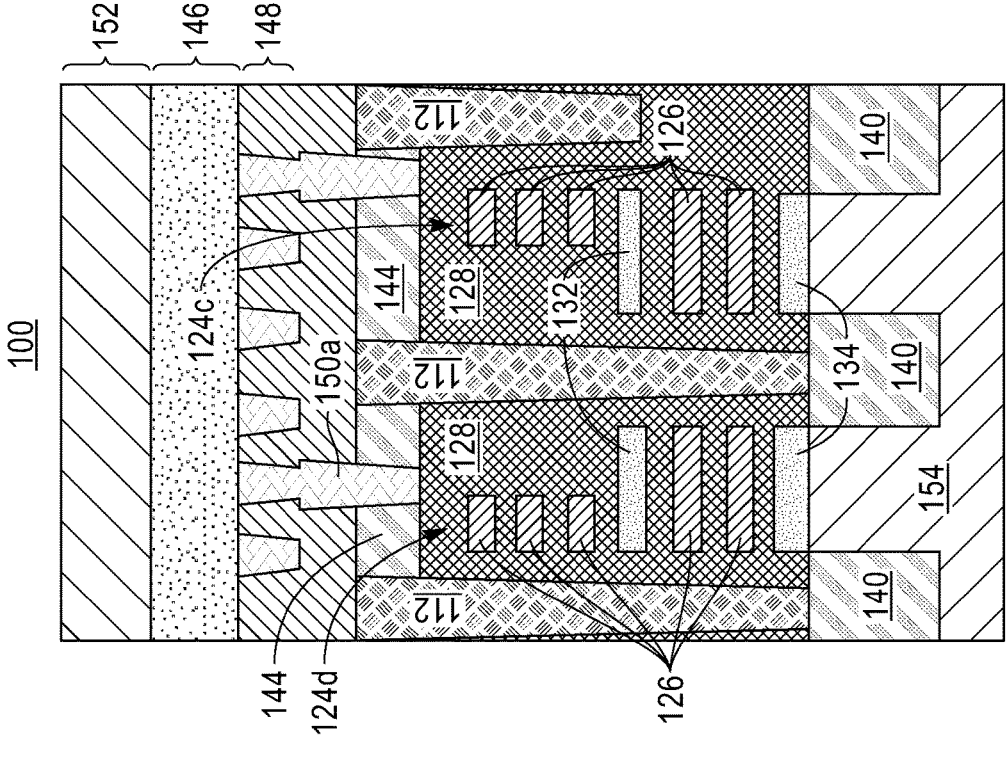
Figure 6B:
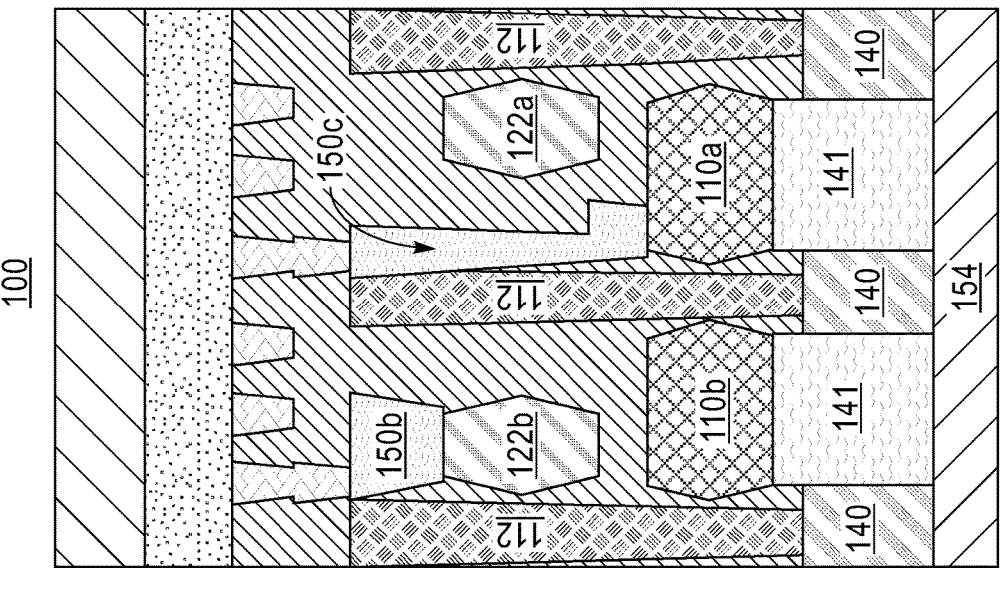

FIGS. 6A, 6B, and 6C depict cross-sectional side views of the semiconductor structure 100 of FIG. 1 at a subsequent fabrication stage of the processing method, in accordance with one embodiment of the present invention. The cross-sectional side views are from the same locations as the figures above. The semiconductor structure 100 includes an insulative backside ILD 154 replacing the etch-stop layer 132 and the device substrate 130. The backside ILD 154 may be formed from the same material as the ILD 142 or the MOL ILD 144. In certain embodiments, the backside ILD 154 is formed from a different material than the ILD 142 and the MOL ILD 144.

Figures 7, 8A:
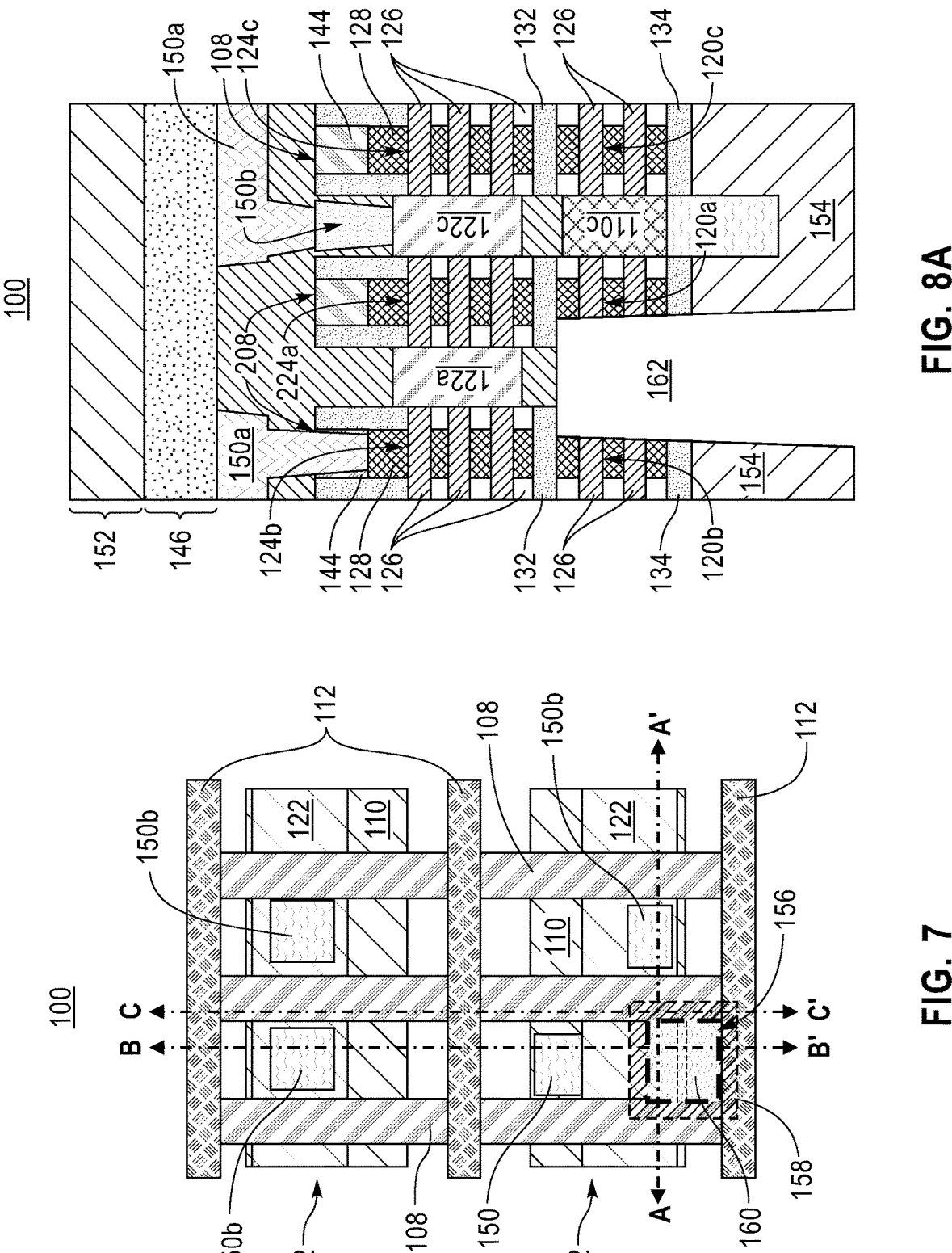
FIG. 7 depicts a schematic top view of the semiconductor structure at a stage of fabrication, in accordance with one embodiment of the present invention.
FIGS. 8A, 8B, and 8C depict cross-sectional side views of the semiconductor structure of FIG. 1 at a fabrication stage of the processing method, in accordance with one embodiment of the present invention.

FIG. 7 depicts a schematic top view of the semiconductor structure 100 at a stage of fabrication, in accordance with one embodiment of the present invention. The semiconductor structure 100 includes the frontside top contacts 150b and the frontside bottom contacts 150c illustrating the connection between the BEOL 146 (not shown in FIG. 7) and the S/Ds 110a, 122a, b. The semiconductor structure 100 also shows a passthrough backside contact 156 formed through at least a portion of the first bottom S/D 122a. The passthrough backside contact 156 includes a self-aligned isolation spacer 158 isolating a conductive core 160 from the channel layers 126 of the first bottom transistor 214 and the HKMG 128 of the first bottom transistor 214. The passthrough backside contact 156 may be formed using the steps illustrated below.

Figures 8B, 8C:
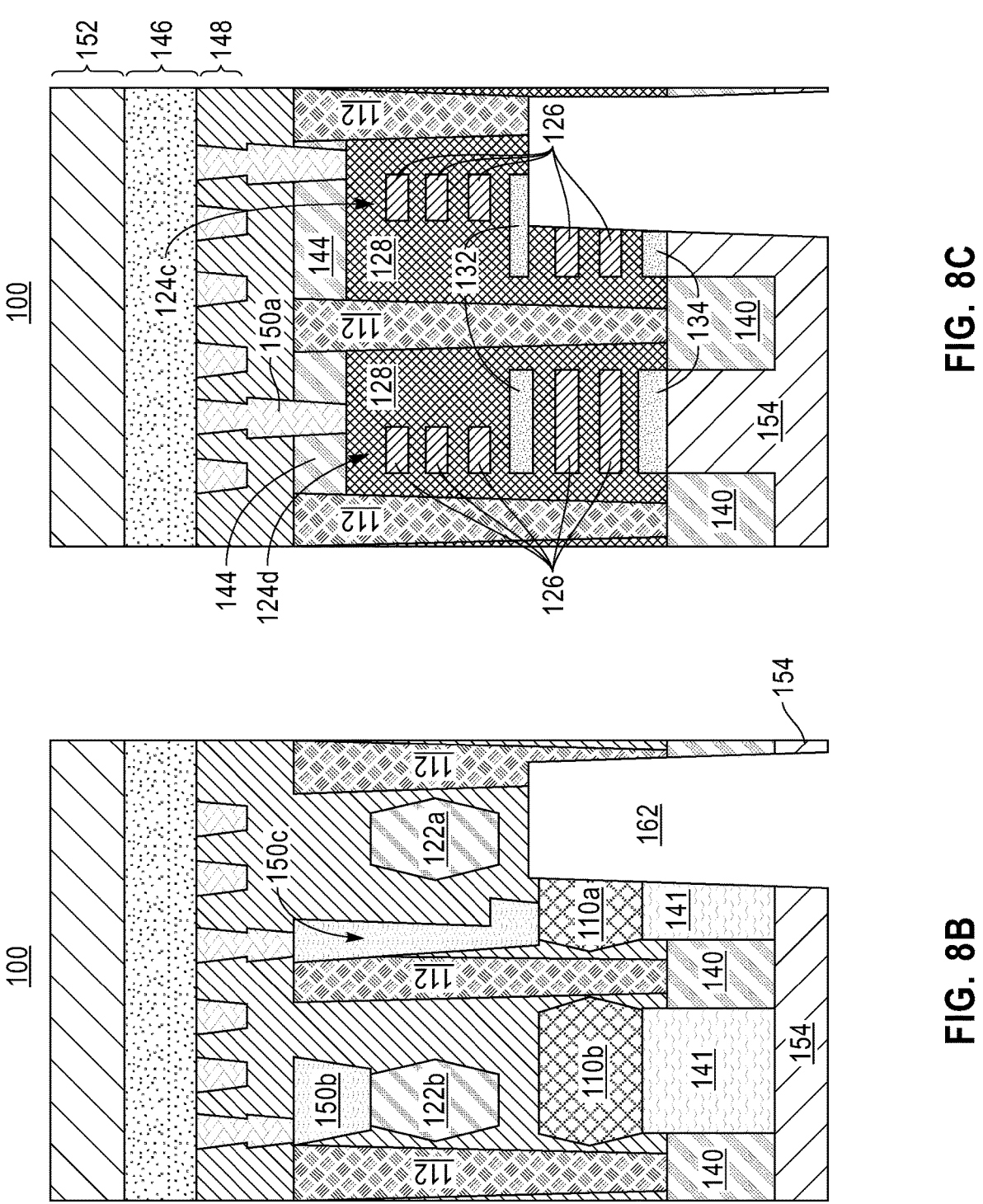

FIGS. 8A, 8B, and 8C depict cross-sectional side views of the semiconductor structure 100 of FIG. 1 at a fabrication stage of the processing method (i.e., subsequent to FIGS. 6A, 6B, and 6C), in accordance with one embodiment of the present invention. The cross-sectional views are from the same locations as the figures above. The semiconductor structure 100 includes a passthrough backside contact hole 162 etched into the backside of the semiconductor structure 100. The passthrough backside contact hole 162 may be etch through at least a portion of the first bottom S/D 110a. The passthrough backside contact hole 162 may be etched using directional etch processes such as reactive ion etch (RIE). In certain embodiments, the passthrough backside contact hole 162 is etched to contact the first top S/D 122a while in certain embodiments (i.e., the illustrated embodiment of FIGS. 8A, 8B, and 8C) the passthrough backside contact hole 162 is etched to stop before reaching the first top S/D 122a.

Figure 9A:
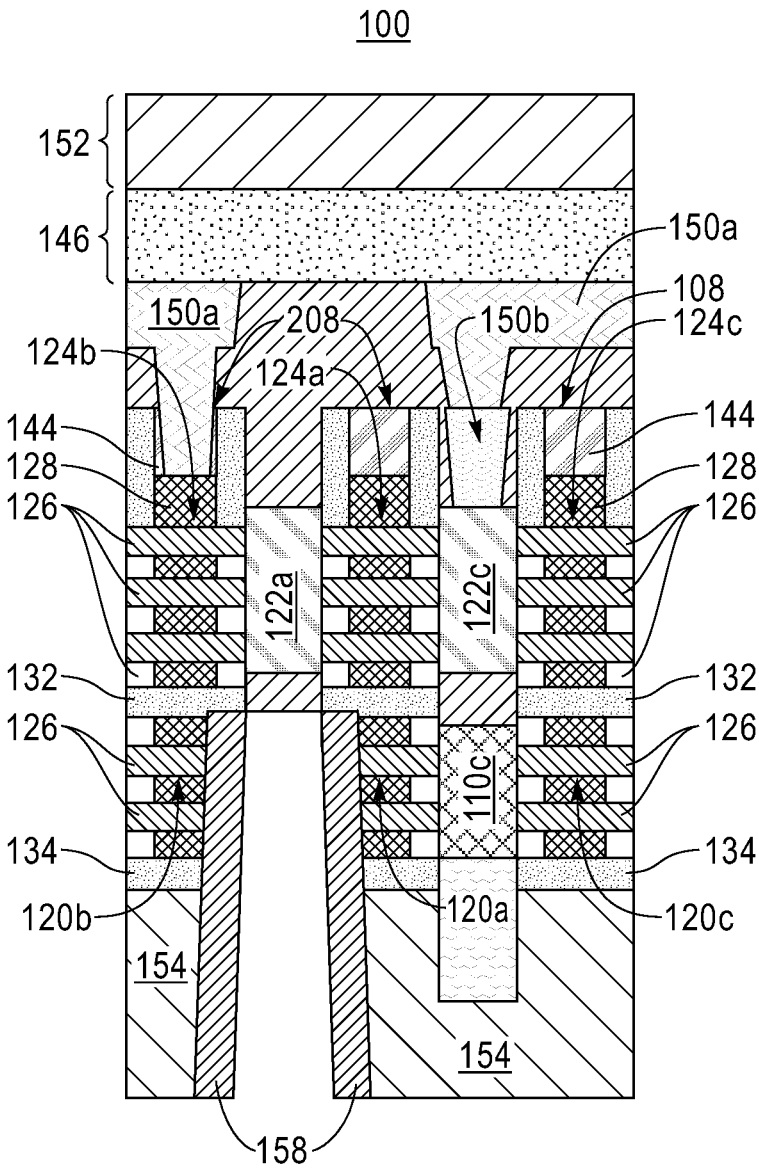
FIGS. 9A, 9B, and 9C depict cross-sectional side views of the semiconductor structure of FIG. 1 at a subsequent fabrication stage of the processing method, in accordance with one embodiment of the present invention.
Figures 9B, 9C:
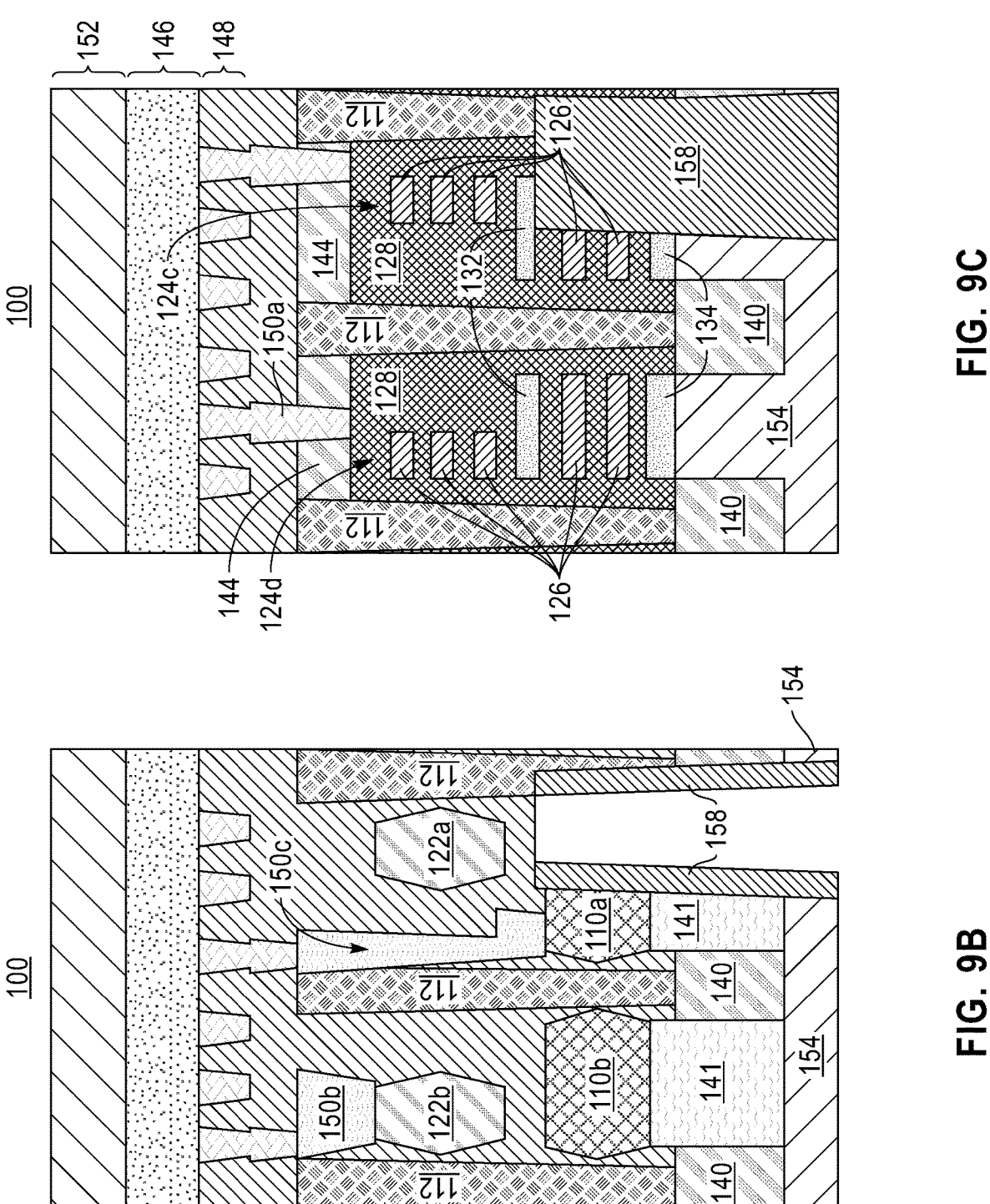

FIGS. 9A, 9B, and 9C depict cross-sectional side views of the semiconductor structure 100 of FIG. 1 at a subsequent fabrication stage of the processing method, in accordance with one embodiment of the present invention. The cross-sectional views are from the same locations as the figures above. The semiconductor structure 100 includes the self-aligned isolation spacer 158 lining the passthrough backside contact hole 162. The self-aligned isolation spacer 158 may be formed by depositing a dielectric layer along the surface of the semiconductor structure 100 and then etching back the dielectric layer to expose the backside ILD 154 and the ILD 142 at the bottom of the passthrough backside contact hole 162.

Figure 10A:
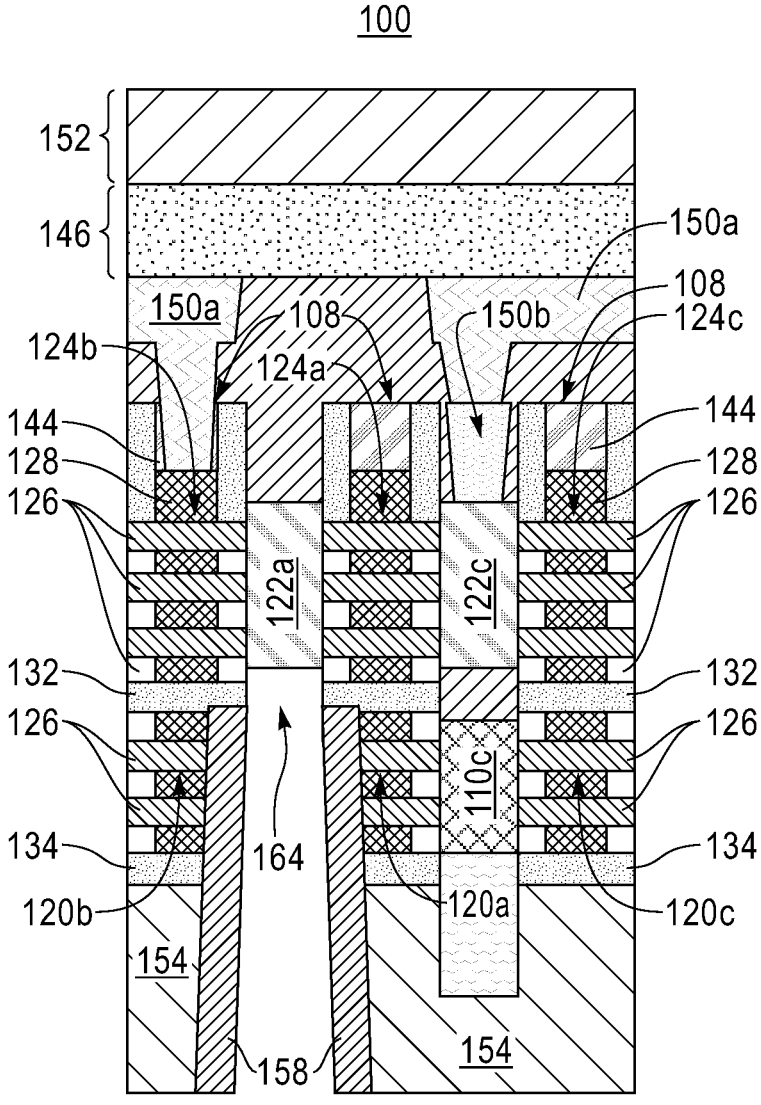
FIGS. 10A, 10B, and 10C depict cross-sectional side views of the semiconductor structure of FIG. 1 at a subsequent fabrication stage of the processing method, in accordance with one embodiment of the present invention.
Figures 10B, 10C:
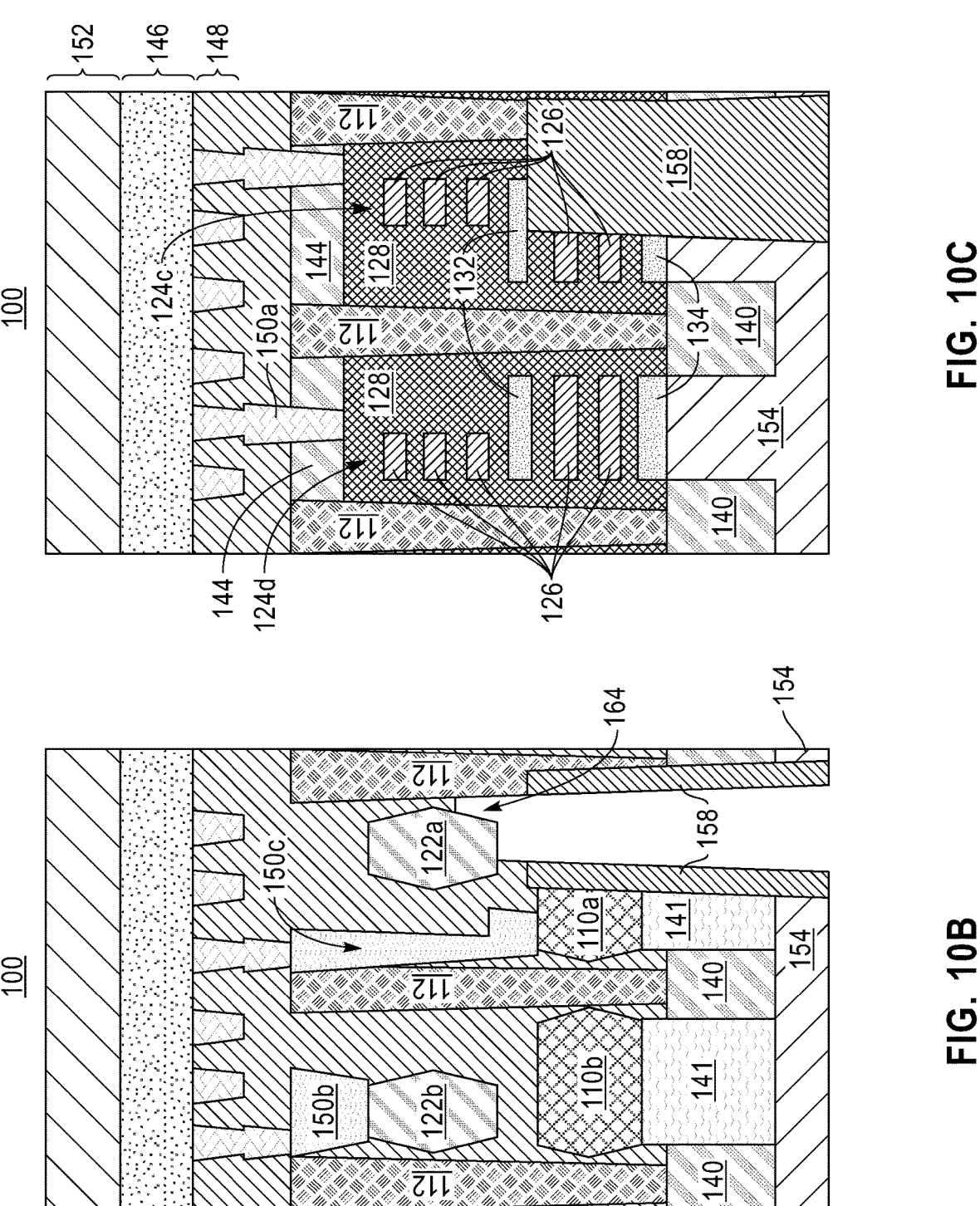

FIGS. 10A, 10B, and 10C depict cross-sectional side views of the semiconductor structure 100 of FIG. 1 at a subsequent fabrication stage of the processing method, in accordance with one embodiment of the present invention. The cross-sectional views are from the same locations as the figures above. The semiconductor structure 100 shows a contact opening 164 in the ILD 142 between the self-aligned isolation spacer 158 and the first top S/D 122a. The contact opening 164 may be formed using a selective etch process that does not affect the first top S/D 122a. Using a selective etch process may expose multiple sides of the first top S/D 122a, which increases the performance of the first top S/D 122a in conveying the signal to the passthrough backside contact 156 (after the eventual formation of the passthrough backside contact 156). Certain embodiments of the passthrough backside contact 156 may not include the step of etching the contact opening 164, but instead etch the initial passthrough backside contact hole 162 to fully make contact with the first top S/D 122a.

Figure 11A:
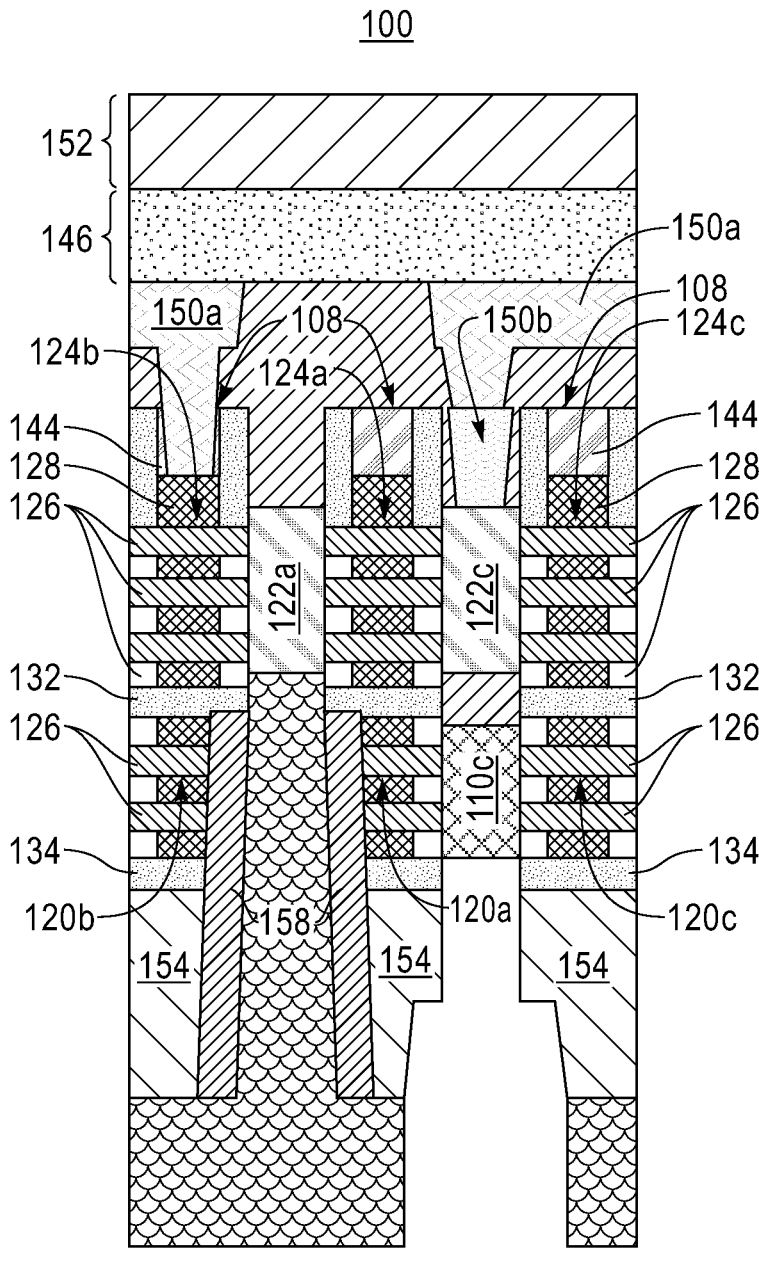
FIGS. 11A, 11B, and 11C depict cross-sectional side views of the semiconductor structure of FIG. 1 at a subsequent fabrication stage of the processing method, in accordance with one embodiment of the present invention.
Figures 11B, 11C:
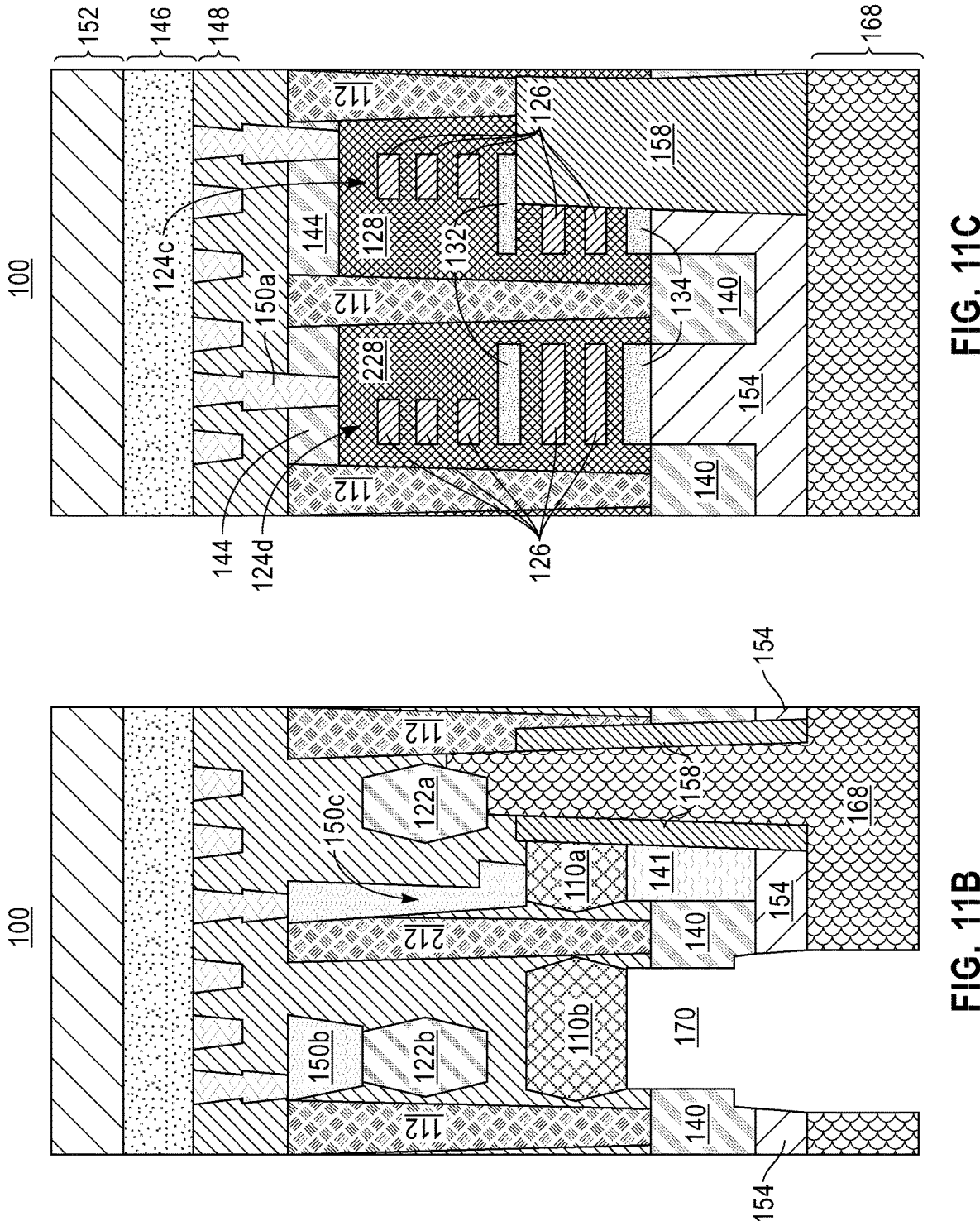

FIGS. 11A, 11B, and 11C depict cross-sectional side views of the semiconductor structure 100 of FIG. 1 at a subsequent fabrication stage of the processing method, in accordance with one embodiment of the present invention. The cross-sectional views are from the same locations as the figures above. The semiconductor structure 100 has, at this stage, an organic planarization layer (OPL) 168 that has been filled into the passthrough backside contact hole 162 and then patterned and etched to expose the placeholder 141 over the second bottom S/D 110b. The placeholder 141 is then removed to open a backside bottom contact hole 170 that has the second bottom S/D 110b exposed at the bottom. The placeholder 141 may be selectively etched, and thus may be formed from a material that is etch-selective to the second bottom S/D 110*b*, the bottom ILD 154, and the STI 140.

Figure 12A:
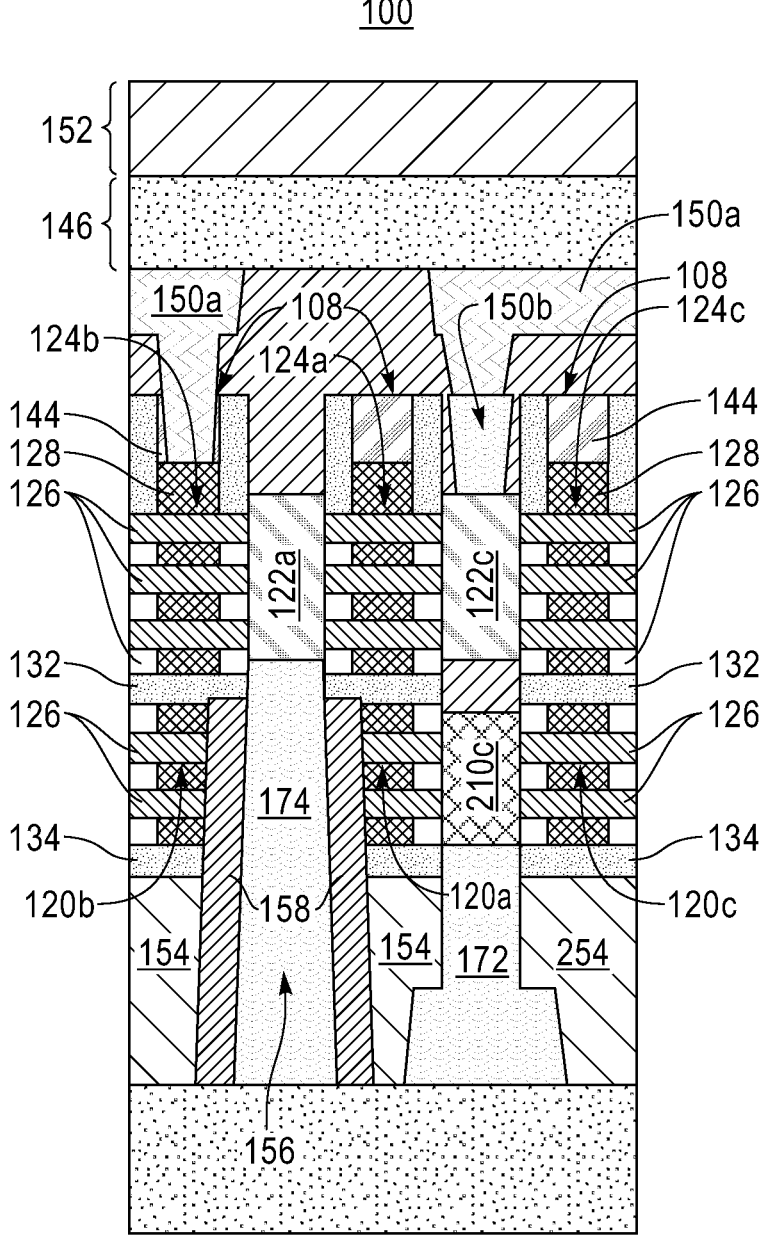
FIGS. 12A, 12B, and 12C depict cross-sectional side views of the semiconductor structure 100 of FIG. 1 at a subsequent fabrication stage of the processing method, in accordance with one embodiment of the present invention.
Figures 12B, 12C:
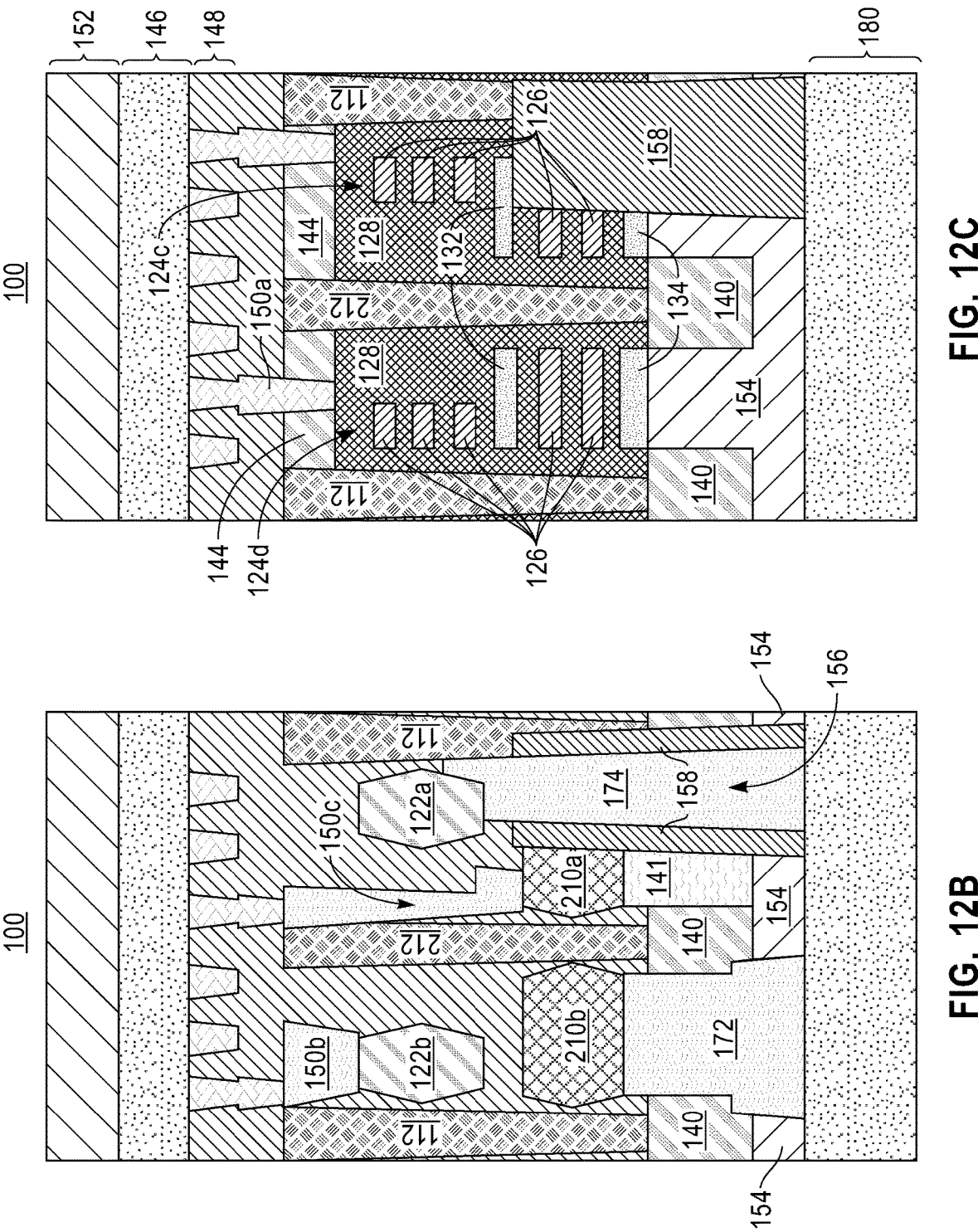

FIGS. 12A, 12B, and 12C depict cross-sectional side views of the semiconductor structure 100 of FIG. 1 at a subsequent fabrication stage of the processing method, in accordance with one embodiment of the present invention. The cross-sectional views are from the same locations as the figures above. The semiconductor structure 100 has the OPL 168 removed and the backside bottom contact hole 170 and passthrough backside contact hole 162 (including the contact opening 164) filled with metal to create backside bottom contacts 172 and a conductive core 174 of the passthrough backside contact 156. The conductive core 174 may extend beyond the self-aligned isolation spacer 158 to connect to the first top S/D 122*a*. Once the backside bottom contacts 172 and passthrough backside contact 156 have been metalized, then the remainder of a backside power delivery network (BSPDN) 180 is built up and fabricated on the backside of the semiconductor structure 100. The BSPDN 180 is not shown to scale and may include several (dozens) interconnected metal layers that convey signals and power to the backside bottom contacts 172, passthrough backside contacts 156, and other contacts fabricated on the backside of the device layer 117.

Figure 13A:
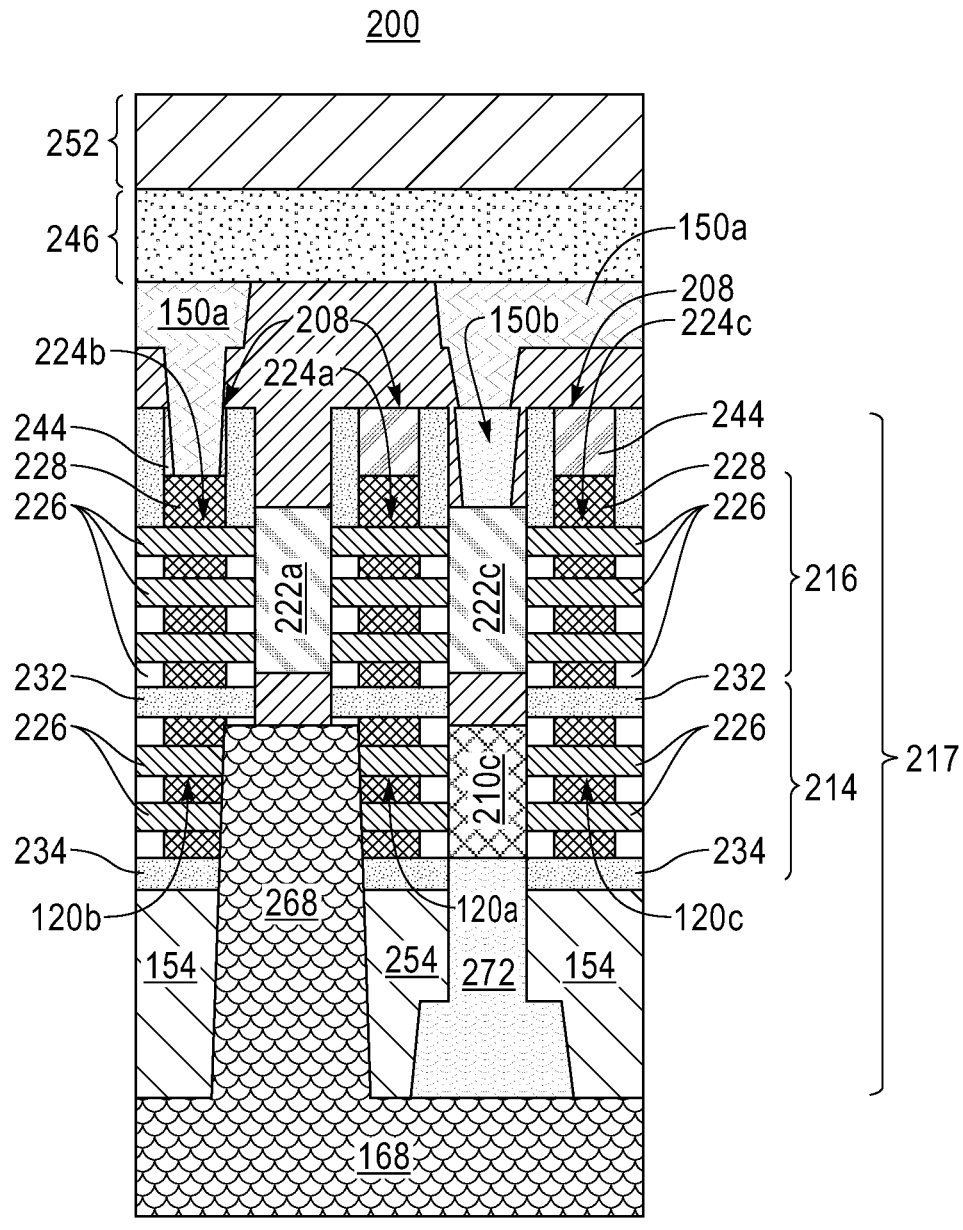
FIGS. 13A, 13B, and 13C depict cross-sectional side views of a semiconductor structure at a fabrication stage of the processing method, in accordance with one embodiment of the present invention.
Figures 13B, 13C:
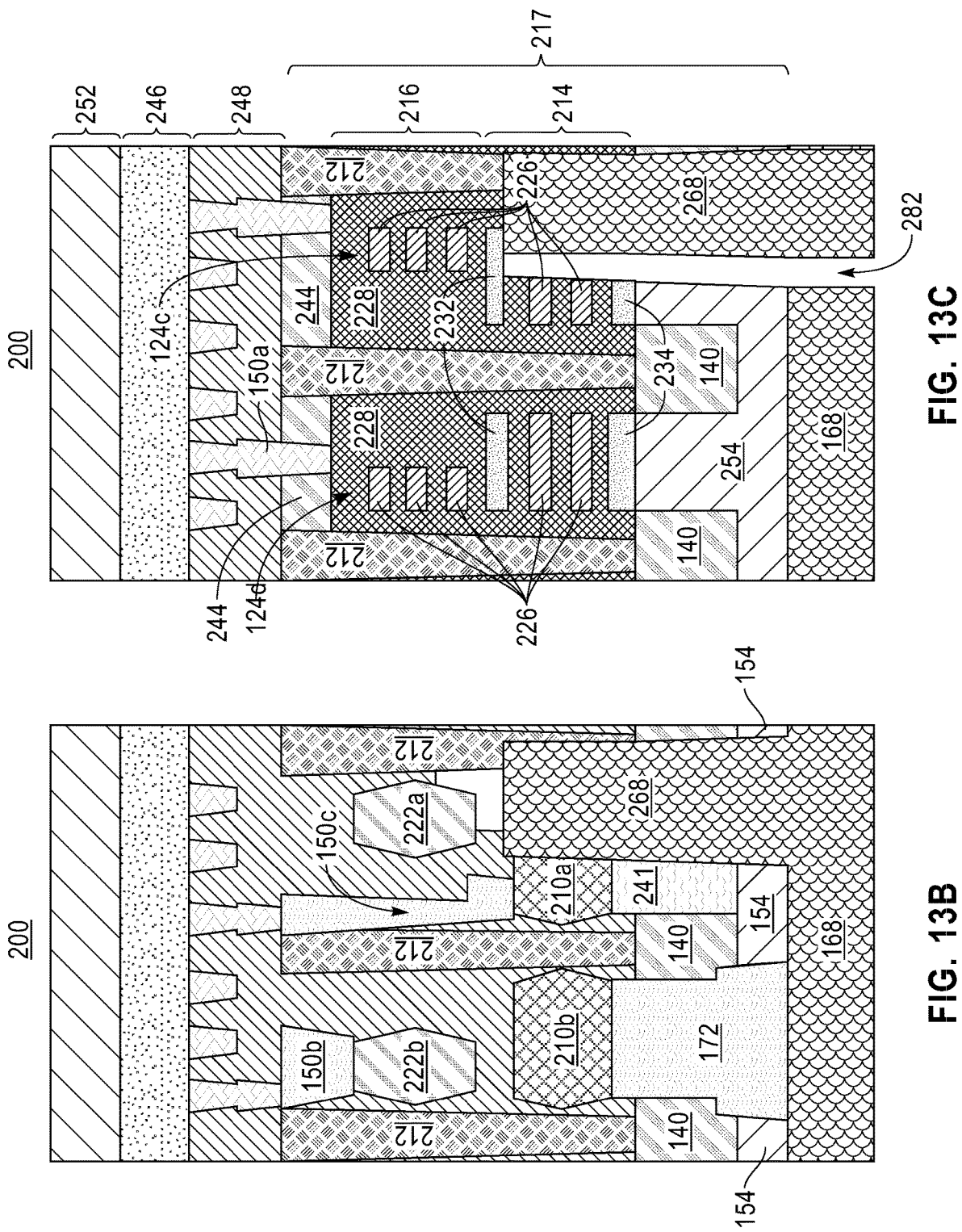

FIGS. 13A, 13B, and 13C depict cross-sectional side views of a semiconductor structure 200 at a fabrication stage of the processing method, in accordance with one embodiment of the present invention. The cross-sectional views are from the same locations illustrated in FIG. 1. The embodiment here differs from embodiment above subsequent to the stage illustrated in FIGS. 8A, 8B, and 8C. That is, rather than proceeding to deposit the self-aligned isolation spacer 158, the semiconductor structure 200 has an OPL 268 applied to the backside of a device layer 217, and a gate addition hole 282 patterned into the OPL 268 and etched down to a middle dielectric isolation layer 232 between channel layers 226 of a top FET 216 and a bottom FET 214.

Figure 14A:
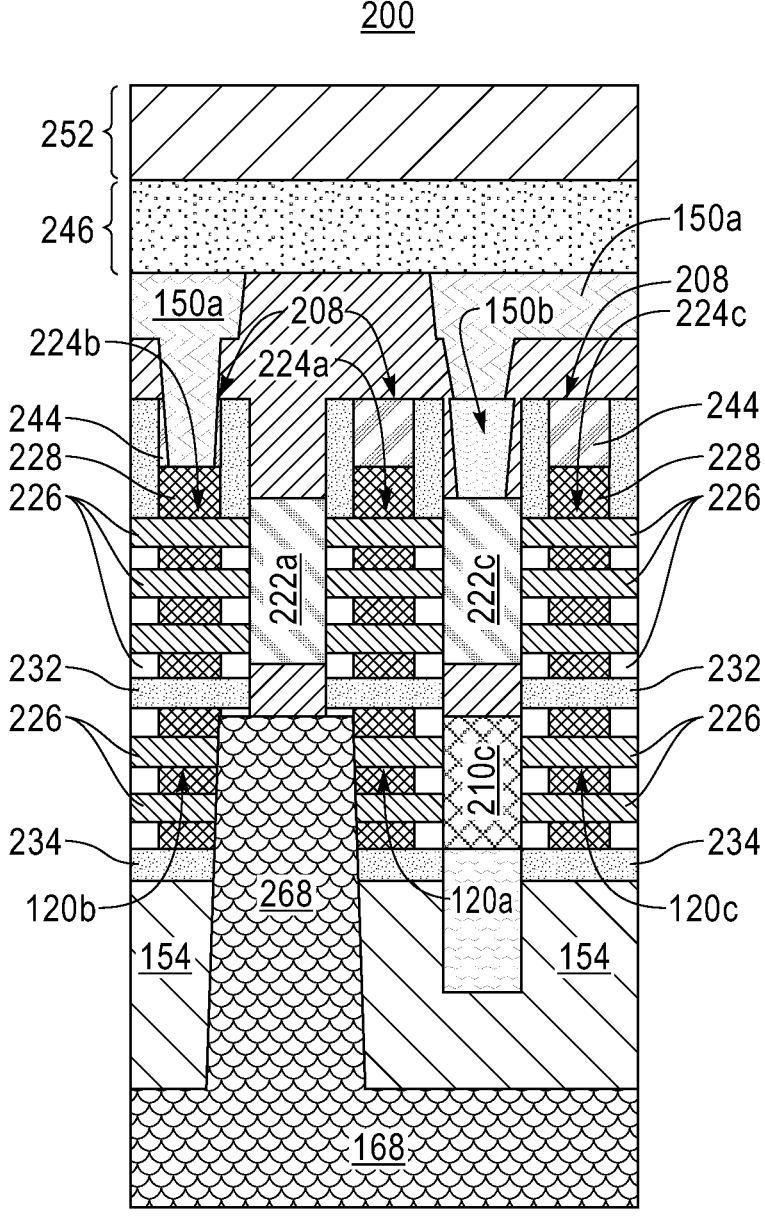
FIGS. 14A, 14B, and 14C depict cross-sectional side views of the semiconductor structure of FIG. 13 at a subsequent fabrication stage of the processing method, in accordance with one embodiment of the present invention.
Figures 14B, 14C:
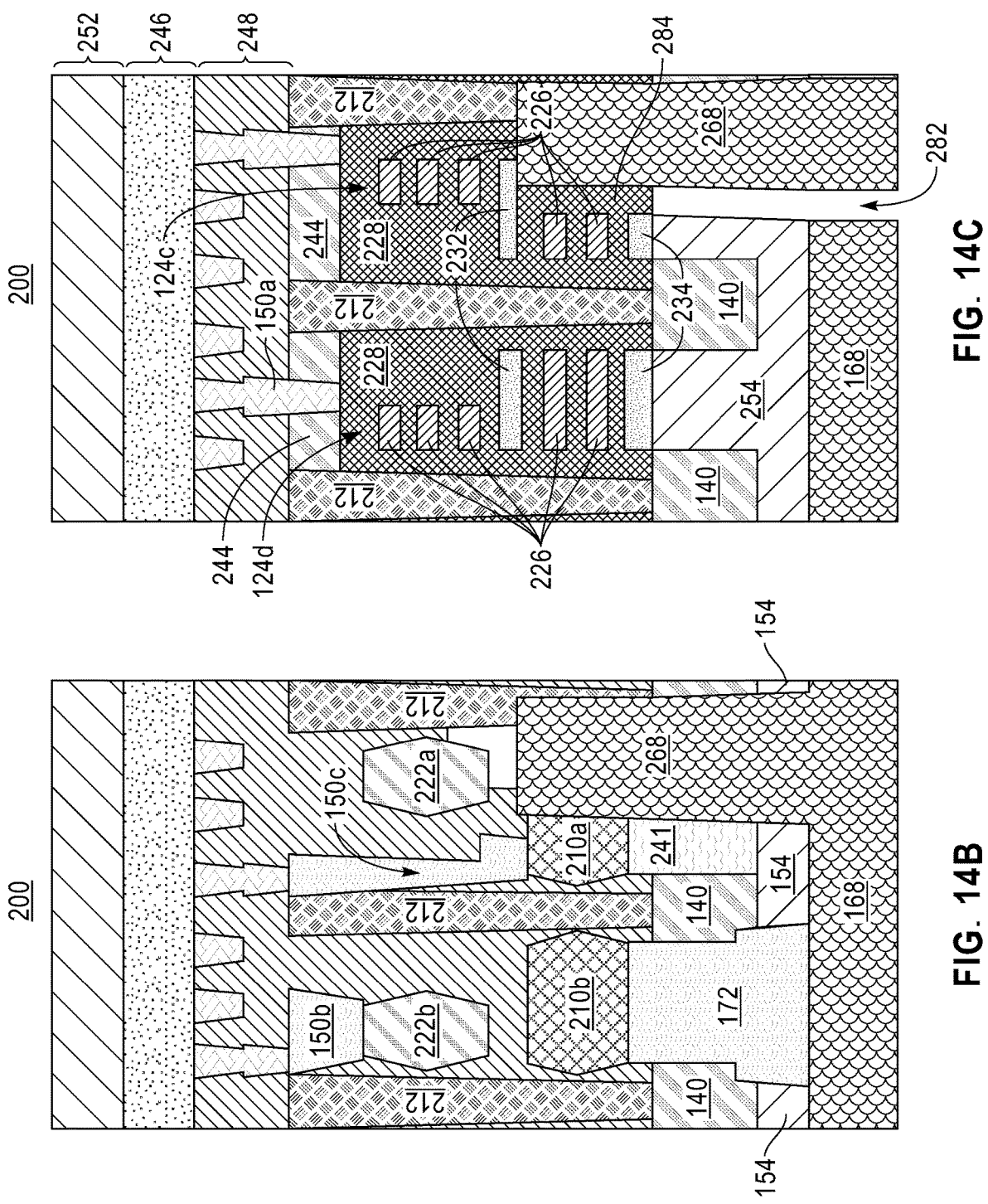

FIGS. 14A, 14B, and 14C depict cross-sectional side views of the semiconductor structure 200 of FIG. 13 at a subsequent fabrication stage of the processing method, in accordance with one embodiment of the present invention. The cross-sectional views are from the same locations as the figures above. The semiconductor structure 200 has an HKMG addition 284 added to the HKMG 228 previously formed around the channel layers 226. The HKMG addition 284 means that the first bottom transistor 214 is a gate all-around nanosheet device rather than a forksheet device like the semiconductor structure 100 described in the Figures above. The HKMG addition 284 may be formed by filling the gate addition hole 282 with HKMG material and then selectively etching the HKMG material back to the correct level within the gate addition hole 282. The OPL 268 may then be removed.

Figure 15A:
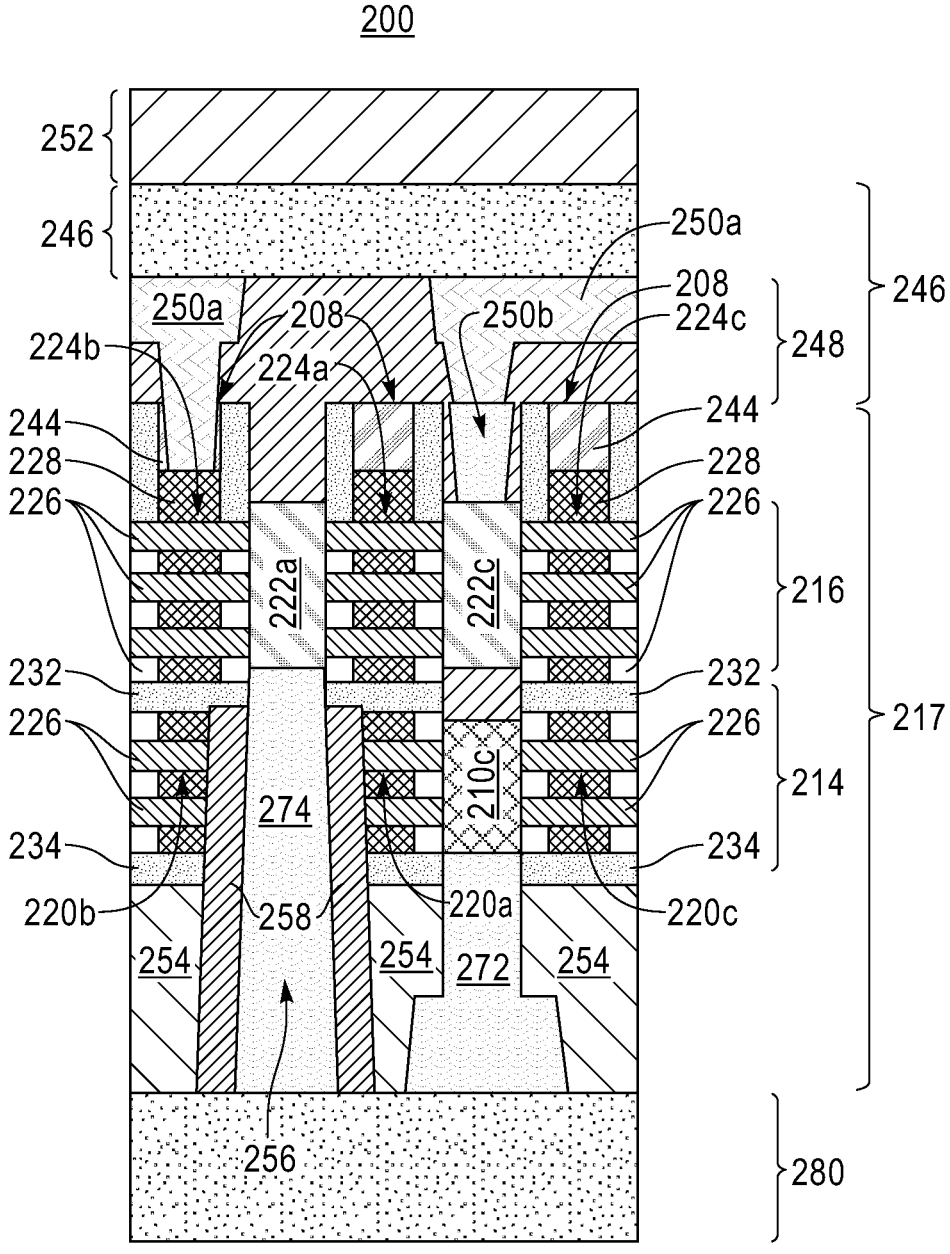
FIGS. 15A, 15B, and 15C depict cross-sectional side views of the semiconductor structure of FIG. 13 at a subsequent fabrication stage of the processing method, in accordance with one embodiment of the present invention.
Figures 15B, 15C:
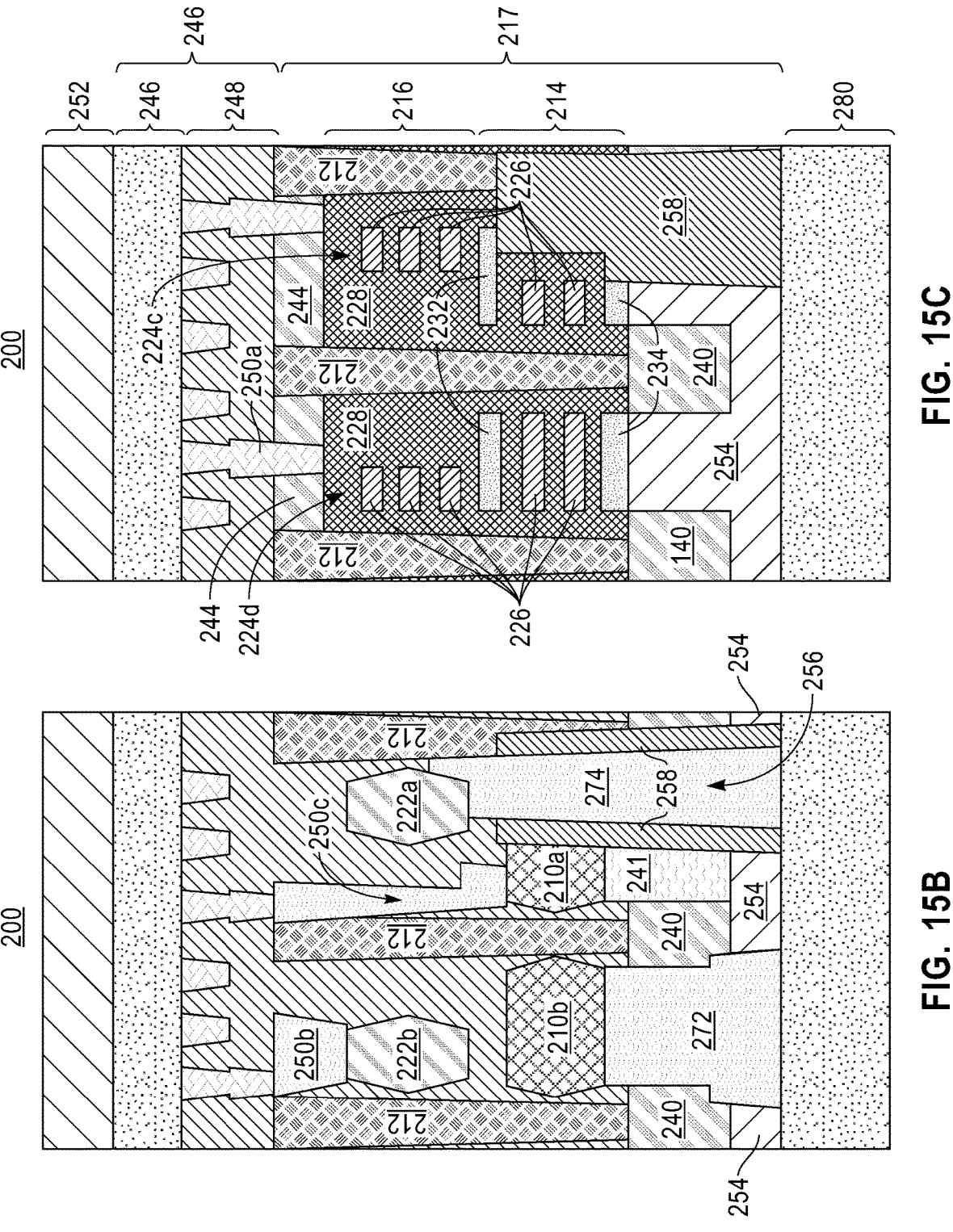

FIGS. 15A, 15B, and 15C depict cross-sectional side views of the semiconductor structure 200 of FIG. 13 at a subsequent fabrication stage of the processing method, in accordance with one embodiment of the present invention. The cross-sectional views are from the same locations as the figures above. The semiconductor structure 200 shows the formation of a passthrough backside contact 256 with a self-aligned isolation spacer 258 and a conductive core 274 formed through the steps illustrated above in FIGS. 9A-12C. The semiconductor structure 200 may operate, therefore, using signals and power from both the BEOL 246 and the BSPDN 280 in a stacked FET device without the requirement of bonding device layers. Rather, the single device layer 217 includes top FETs 216 and bottom FETs 214 operating with one single HKMG 228 for each pair (top/bottom FET) of devices. The top FETs 216 may be in electrical contact with the BSPDN 280 through the passthrough backside contact 256, which communicates a signal through the first top S/D 222*a*, then through a first top gate 224*a* to a third top S/D 222*c*. The third top S/D 222*c* is connected to the first metal level 248 of the BEOL 246. The passthrough backside contact 256 is fabricated through a first bottom S/D 210*a* and is lined with the self-aligned isolation spacer 258 so that the conductive core 274 does not affect the first bottom S/D 210*a* or any of the gates 208.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections and buried interconnections). In any case, the chip may be integrated with other chips, discrete circuit elements, and/or other signal processing devices as part of either an intermediate product or an end product.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
   a first bottom transistor comprising a first bottom source/drain (S/D) electrically connected to a back-end-of-line (BEOL) metal level;
   a second bottom transistor comprising a second bottom S/D electrically connected to a backside power delivery network (BSPDN) below the first bottom transistor and the second bottom transistor; and
   a first top transistor stacked directly above the first bottom transistor comprising a first top S/D electrically connected to the BSPDN by a passthrough backside contact formed through at least a portion of the first bottom S/D.

2. The semiconductor structure of claim 1, wherein the passthrough backside contact comprises a self-aligned isolation spacer isolating a conductive core from a channel of the first bottom transistor and a gate of the first bottom transistor.

3. The semiconductor structure of claim 1, wherein the first bottom transistor comprises a forksheet device.

4. The semiconductor structure of claim 1, wherein the first bottom transistor comprises a gate all-around nanosheet device.

5. The semiconductor structure of claim 1, further comprising a high-k metal gate (HKMG) surrounding a channel of the first top transistor and a channel of the first bottom transistor.

6. The semiconductor structure of claim 1, further comprising a middle dielectric isolation directly between the first top transistor and the first bottom transistor.

7. The semiconductor structure of claim 1, wherein the second bottom S/D comprises a lateral dimension that is at least two times bigger than a lateral dimension of the first top S/D.

8. A method of fabricating a semiconductor structure, comprising:

forming a stacked field-effect transistor (FET) comprising a first top transistor stacked directly above a first bottom transistor;

forming a back-end-of-line (BEOL) metal level comprising a first bottom contact electrically connected between the BEOL metal level and the first bottom transistor;

forming a passthrough backside contact hole through at least a portion of a first bottom source/drain (S/D) of the first bottom transistor;

forming a self-aligned isolation spacer in the passthrough backside contact hole; and forming a conductive core within the isolation spacer, wherein the conductive core electrically connects a top S/D of the first top transistor to a backside power delivery network (BSPDN).

9. The method of claim 8, further comprising flipping the semiconductor structure and removing a substrate.

10. The method of claim 8, further comprising forming a contact opening in an interlayer dielectric between the isolation spacer and the top S/D.

11. The method of claim 8, further comprising forming a bottom backside contact between a second bottom S/D and the BSPDN.

12. The method of claim 8, further comprising forming a portion of a gate of the first bottom transistor after forming the passthrough backside contact hole.

13. The method of claim 8, wherein forming the first bottom transistor comprises forming a forksheet device.

14. A semiconductor structure, comprising:

a first top source/drain (S/D);

a first bottom S/D stacked directly below the first top S/D;

a backside power delivery network (BSPDN) below the bottom S/D;

a back-end-of-line (BEOL) interconnect network above the top S/D; and a passthrough backside contact electrically connecting the first bottom S/D to the BSPDN.

15. The semiconductor structure of claim 14, wherein the passthrough backside contact is formed through at least a portion of the first bottom S/D.

16. The semiconductor structure of claim 14, wherein the passthrough backside contact comprises a self-aligned isolation spacer isolating a conductive core from a channel and a gate adjacent to the first bottom S/D.

17. The semiconductor structure of claim 16, wherein the conductive core extends beyond the self-aligned isolation spacer to connect to the first top S/D.

18. The semiconductor structure of claim 14, further comprising a high-k metal gate (HKMG) surrounding channels connected to the first top S/D and the first bottom S/D.

19. The semiconductor structure of claim 18, further comprising an additional S/D connected between the HKMG and the BEOL.

20. The semiconductor structure of claim 14, further comprising:

a second bottom S/D adjacent to the first bottom S/D; and a bottom S/D contact electrically connecting the second bottom S/D to the BSPDN.

* * * * *